United States Patent
Moon et al.

(10) Patent No.: US 9,831,164 B2
(45) Date of Patent: *Nov. 28, 2017

(54) SEMICONDUCTOR DEVICE AND METHOD OF FABRICATING THE SAME

(71) Applicant: Samsung Electronics Co., Ltd., Suwon-Si (KR)

(72) Inventors: Kwang-jin Moon, Suwon-si (KR); Pil-kyu Kang, Anyang-si (KR); Dae-lok Bae, Seoul (KR); Gil-heyun Choi, Seoul (KR); Byung-lyul Park, Seoul (KR); Dong-chan Lim, Suwon-si (KR); Deok-young Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/756,593

(22) Filed: Feb. 1, 2013

(65) Prior Publication Data

US 2014/0217603 A1      Aug. 7, 2014

Related U.S. Application Data

(63) Continuation of application No. 12/913,748, filed on Oct. 27, 2010, now Pat. No. 8,390,120.

(30) Foreign Application Priority Data

Jun. 28, 2010   (KR) .................. 10-2010-0061080

(51) Int. Cl.
*H01L 23/48*     (2006.01)
*H01L 23/498*    (2006.01)
(Continued)

(52) U.S. Cl.
CPC .. *H01L 23/49827* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS 5,426,072 A *   6/1995   Finnila ........................ 438/107
7,687,311 B1    3/2010   Lee et al. .................... 438/106
(Continued)

FOREIGN PATENT DOCUMENTS

CN      101558483 A     10/2009
CN      101740417 A     6/2010
(Continued)

OTHER PUBLICATIONS

Chinese Patent Publication No. 101740417 to Lee et al., (w/ English Abstract).
(Continued)

*Primary Examiner* — Ori Nadav
*Assistant Examiner* — Ernest Allen, III
(74) *Attorney, Agent, or Firm* — Monica H. Choi

(57) ABSTRACT

A semiconductor device includes a via structure and a conductive structure. The via structure has a surface with a planar portion and a protrusion portion. The conductive structure is formed over at least part of the planar portion and not over at least part of the protrusion portion of the via structure. For example, the conductive structure is formed only onto the planar portion and not onto any of the protrusion portion for forming high quality connection between the conductive structure and the via structure.

15 Claims, 29 Drawing Sheets

(51) Int. Cl.
- *H01L 21/768* (2006.01)
- *H01L 23/522* (2006.01)
- *H01L 23/528* (2006.01)

(52) U.S. Cl.
CPC ........ *H01L 23/528* (2013.01); *H01L 23/5223* (2013.01); *H01L 23/5226* (2013.01); *H01L 2924/0002* (2013.01)

(56) References Cited

U.S. PATENT DOCUMENTS

| | | | |
|---|---|---|---|
| 8,354,730 B2 | 1/2013 | Moriya et al. | 257/520 |
| 8,390,120 B2 * | 3/2013 | Moon | H01L 23/481 257/744 |
| 2002/0030245 A1 * | 3/2002 | Hanaoka et al. | 257/621 |
| 2010/0038800 A1 * | 2/2010 | Yoon | H01L 21/76898 257/774 |
| 2010/0096753 A1 | 4/2010 | Hwang et al. | |
| 2010/0276787 A1 * | 11/2010 | Yu | H01L 21/6836 257/621 |
| 2014/0035164 A1 * | 2/2014 | Moon | H01L 23/5226 257/774 |
| 2014/0187040 A1 | 7/2014 | Enquist et al. | |

FOREIGN PATENT DOCUMENTS

| | | |
|---|---|---|
| JP | 2005-150299 | 6/2005 |
| WO | WO 2007/023947 | 3/2007 |

OTHER PUBLICATIONS

Chinese Patent Publication No. 101558483 to Enquist et al., (w/ English Abstract).
Japanese Publication No. 2005-150299 to Kuniyasu, having Publication date of Jun. 9, 2005 (w/ English Abstract).
PCT Publication No. WO 2007/023947 to Moriya et al., having Publication date of Mar. 1, 2007 (w/ English Abstract).
Japanese Publication No. 2009252924 to Matsunaga, having Publication date of Oct. 29, 2009 (w/ English Abstract).

* cited by examiner

SEMICONDUCTOR DEVICE AND METHOD OF FABRICATING THE SAME

CROSS-REFERENCE TO RELATED APPLICATION(S)

The present application is a continuation application of an earlier filed copending patent application with Ser. No. 12/913,748 filed on Oct. 27, 2010, for which priority is claimed. This earlier filed copending patent application with Ser. No. 12/913,748 is in its entirety incorporated herewith by reference.

The present application also claims priority under 35 USC §119 to Korean Patent Application No. 10-2010-0061080, filed on Jun. 28, 2010, in the Korean Intellectual Property Office, the disclosure of which is incorporated herein in its entirety by reference. A certified copy of Korean Patent Application No. 10-2010-0061080 is contained in the parent copending patent application with Ser. No. 12/913,748.

TECHNICAL FIELD

The present invention relates generally to semiconductor devices, and more particularly, to a semiconductor device and a method of fabricating the same to include a conductive structure formed onto a partial portion of a top surface of a via structure.

BACKGROUND OF THE INVENTION

Conductive lines and vias are commonly used as interconnect structures to form an integrated circuit of a semiconductor device. Vias are used to connect conductive lines formed on multiple levels of interconnect layers.

In addition, through silicon vias (TSVs) are formed through the silicon substrate for coupling multiple integrated circuit chips to form a stacked semiconductor device. Such a stacked semiconductor device is formed to provide an integrated circuit with high capacity and low area.

With any type of via, a conductive line is desired to be formed onto the via with high quality of contact. Such a high quality contact is desired for connection between the via and the conductive line with low resistance and high current capacity.

SUMMARY OF THE INVENTION

Accordingly, a conductive structure is formed over a planar portion of a via structure to ensure a high quality connection between the conductive structure and the via structure.

According to an aspect of the present invention, a semiconductor device includes a via structure and a conductive structure. The via structure has a surface with a planar portion and a protrusion portion. The conductive structure is formed over at least part of the planar portion and not over at least part of the protrusion portion of the via structure.

In an example embodiment of the present invention, the conductive structure is formed only onto the planar portion and not onto any of the protrusion portion. For example, the conductive structure is formed onto from about 5% to about 80% of an area of the surface of the via structure.

In another example embodiment of the present invention, the semiconductor device further includes a buffer layer formed onto the protrusion portion of the via structure. Furthermore, a dielectric layer is formed over the protrusion portion of the via structure and surrounds the conductive structure.

In a further example embodiment of the present invention, the via structure is a TSV (through silicon via) formed within an opening through at least one dielectric layer and a semiconductor substrate. For example, the TSV includes an insulation layer formed at a wall of the opening, and includes a barrier layer formed on the insulation layer within the opening. The TSV also includes a conductive fill formed within the opening with the barrier layer surrounding at least a portion of the conductive fill.

In another example embodiment of the present invention, the TSV further includes a center fill formed within the opening with the conductive fill surrounding at least a portion of the center fill. The center fill has a thermal expansion coefficient that is lower than that of the conductive fill such that the protrusion portion is formed as a ring with minimized height of the protrusion portion.

In a further example embodiment of the present invention, the TSV is coupled to a contact structure of another semiconductor device for forming a stacked semiconductor device. For example, the stacked semiconductor device is a memory device.

In another example embodiment of the present invention, the semiconductor device further includes another conductive structure formed onto at least part of the planar portion and not onto the protrusion portion of the via structure. In addition, a linking structure couples the conductive structures.

In a further example embodiment of the present invention, the conductive structure includes an opening formed over the at least part of the protrusion portion of the via structure.

In another example embodiment of the present invention, the semiconductor device further includes another via structure having a respective surface with a respective planar portion and a respective protrusion portion. The conductive structure is formed onto the planar portions and not onto the protrusion portions of the multiple via structures.

In a further example embodiment of the present invention, the semiconductor device further includes a plurality of via structures and a plurality of conductive structures. Each via structure has a respective surface with a respective planar portion and a respective protrusion portion. Each conductive structure is formed onto the planar portions and not onto the protrusion portions of a respective set of at least two of the multiple via structures. In addition, a linking structure couples the plurality of conductive structures.

According to another aspect of the present invention, a stacked semiconductor device includes a first integrated circuit chip and a second integrated circuit chip. The first integrated circuit chip includes a via structure and a conductive structure. The via structure has a surface with a planar portion and a protrusion portion. The conductive structure is formed over at least part of the planar portion and not over at least part of the protrusion portion of the via structure. The second integrated circuit chip includes a contact structure coupled to the via structure of the first integrated circuit chip.

The conductive structure and the via structure of the first integrated circuit chip of the stacked semiconductor device may be formed with further embodiments as described above.

According to a further aspect of the present invention, a semiconductor device includes a via structure formed through a semiconductor substrate. The via structure has a surface with a center portion and an outer portion. The semiconductor substrate also includes a conductive structure formed over at least part of the outer portion and not over at least part of the center portion of the via structure.

In an example embodiment of the present invention, the center portion is formed to be flat with the outer portion such that the center portion is planar with the outer portion of the via structure. In an alternative embodiment of the present invention, the center portion protrudes from the outer portion of the via structure.

According to a further aspect of the present invention, a method for fabricating a semiconductor device includes a step of forming a via structure having a surface with a planar portion and a protrusion portion. In addition, the method also includes the step of forming a conductive structure over at least part of the planar portion and not over at least part of the protrusion portion of the via structure.

In another embodiment of the present invention, the method further includes the steps of heating the via structure to form an initial protrusion portion of the via structure and planarizing the initial protrusion portion to decrease a height of the resulting protrusion portion of the via structure before forming the conductive structure.

The conductive structure and the via structure according to the method embodiments may be formed with further embodiments as described above.

In this manner, the conductive structure is formed onto a planar portion of the via structure and not onto the protrusion portion of the via structure. Thus, the conductive structure connects to the via structure with low resistance and high current capacity.

These and other features and advantages of the present invention will be better understood by considering the following detailed description of the invention which is presented with the attached drawings.

Figure 1A:
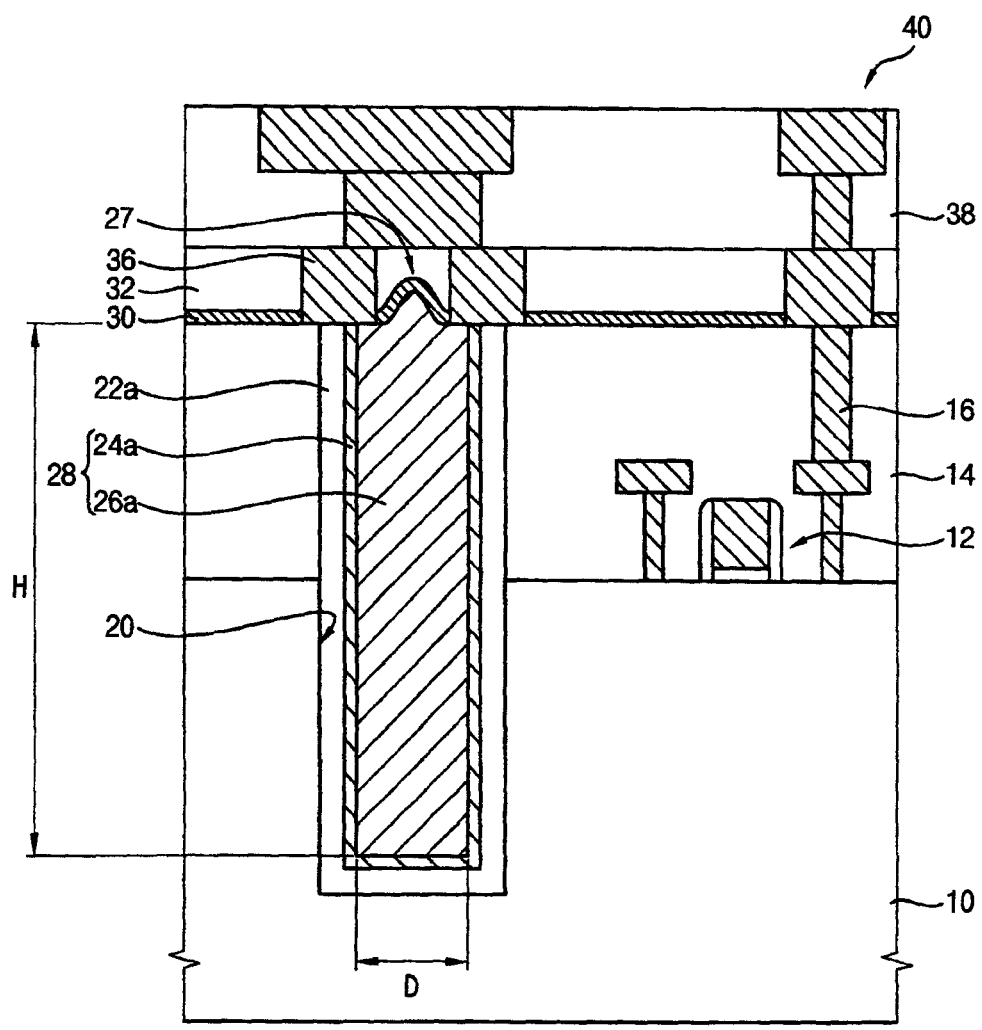
FIG. 1A is a cross-sectional view of a semiconductor device having via and conductive structures, according to an example embodiment of the present invention.

The figures referred to herein are drawn for clarity of illustration and are not necessarily drawn to scale. Elements having the same reference number in FIGS. 1A, 1B, 2, 3, 4, 5, 6, 7, 8, 9, 10, 11, 12, 13, 14, 15, 16, 17, 18A, 18B, 19, 20, 21, 22, 23, 24, 25, 26, 27, 28, 29, 30, 31, 32, 33, 34, and 35 refer to elements having similar structure and/or function, unless stated other-wise.

DETAILED DESCRIPTION

Various example embodiments are described more fully hereinafter with reference to the accompanying drawings, in which example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

For example, if the device in the figures is turned over, elements described as "below" or "beneath" other elements or features would then be oriented "above" or "over" the other elements or features. Thus, the exemplary term "below" can encompass both an orientation of above and below. The device may be otherwise oriented (rotated 90 degrees or at other orientations), and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations of idealized example embodiments (and intermediate structures). As such, variations from the shapes of the illustrations as a result, for example, of fabrication techniques and/or tolerances, are to be expected. Thus, example embodiments should not be construed as limited to the particular shapes of regions illustrated herein but are to include deviations in shapes that result, for example, from variations during fabrication.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1B:
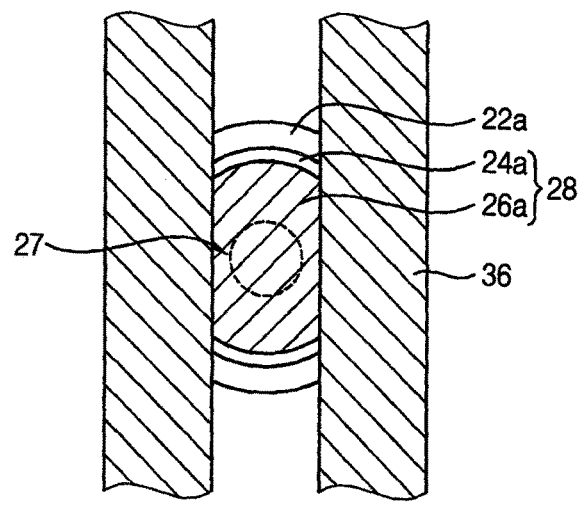
FIG. 1B is a top view of the semiconductor device of FIG. 1A, according to an example embodiment of the present invention.

FIG. 1A is a cross-sectional view of a semiconductor device having via and conductive structures, according to an example embodiment of the present invention. FIG. 1B is a top view of the semiconductor device of FIG. 1A, according to an example embodiment of the present invention.

Referring to FIGS. 1A and 1B, a first circuit pattern 12 is formed on a first substrate 10. The first substrate 10 is comprised of a semiconductor material, such as single crystalline silicon for example. The first circuit pattern 12 includes transistors, diodes, and the like for forming an integrated circuit for example.

A first insulating interlayer 14 is formed to surround the first circuit pattern 12 on the first substrate 10. A lower wiring 16 comprised of a conductive material such as doped polysilicon or a metal for example is formed to be electrically connected to the first circuit pattern 12. In an example embodiment, the lower wiring 16 has a top surface that is coplanar with a top surface of the first insulating interlayer 14.

Further referring to FIGS. 1A and 1B, a via hole 20 is formed as an opening through the first insulating interlayer 14 and through at least a portion of the first substrate 10. The present invention may be practiced with formation of a plurality of via holes 20. An insulation layer pattern 22a is formed on an inner wall of the via hole 20. The insulation layer pattern 22a electrically insulates the first substrate 10 from a through silicon via (TSV) contact 28 comprised of a conductive material.

The TSV structure 28 is an example via structure for being coupled to a conductive line structure. However, the present invention may be practiced with any type of via structure for being connected to a conductive line structure.

A barrier layer pattern 24a is formed on the insulation layer pattern 22a. The barrier layer pattern 24a is comprised of a metal or a metal nitride such as tantalum, tantalum nitride, titanium, titanium nitride, ruthenium, cobalt, nickel, nickel boride, tungsten nitride, and the like, in an example embodiment of the present invention. Such material may be used alone or in a combination thereof.

A conductive fill 26a is formed to fill a remaining portion of the via hole 20 surrounded by the barrier layer pattern 24a. The conductive fill 26a is comprised of a metal having a low resistance and a thermal expansion coefficient equal to or more than about 1.5 times that of silicon, according to an example embodiment of the present invention. For example, the conductive fill 26a is comprised of copper, aluminum, gold, indium, nickel, and the like, alone or in a combination thereof. In an example present embodiment, the conductive fill 26a is comprised of copper. The conductive fill 26a and the barrier layer pattern 24a form the TSV structure 28 as an example via structure.

The via structure 28 includes a surface including an outer portion and a center portion 27 facing up away from the substrate 10 as shown in the top view of FIG. 1B. Referring to FIGS. 1A and 1B, the outer portion is disposed adjacent at least one surrounding material such as the insulation layer pattern 22a, and the center portion 27 is surrounded by the outer portion.

Referring to FIGS. 1A and 1B, the outer portion of the via structure 28 is comprised of the barrier layer pattern 24a and a portion of the conductive fill 26a having a top surface that is parallel with a surface of the substrate 10. Another words, the outer portion of the via structure 28 is comprised of the barrier layer pattern 24a and the portion of the conductive fill 26a having the top surface that is coplanar with the surrounding first insulating interlayer 14, in an example embodiment of the present invention. Thus, such an outer portion of the via structure 28 is also referred to as a planar portion of the via structure 28.

The via structure 28 further includes the center portion 27 that is protruded from the outer portion of the via structure 28. Another words, the center portion 27 includes parts of a top surface (shown in the top view of FIG. 1B) of the conductive fill 26a that extends further from the plane of the outer portion and the plane of surrounding first insulating interlayer 14. Thus, such a center portion of the via structure 28 is also referred to as a protrusion portion of the via structure 28. When the conductive fill 26a is comprised of copper, the protrusion portion 27 of the via structure 28 may be formed by thermal expansion of such copper during subsequent fabrication of the semiconductor device of FIGS. 1A and 1B.

In the example embodiment of FIGS. 1A and 1B, the conductive fill 26a has a height H of from about 10 μm to about 100 μm. In an example preferred embodiment, the height H is in a range of from about 30 μm to about 80 μm. In addition, the conductive fill 26a has a diameter D of from about 1 μm to about 15 μm. In an example preferred embodiment, the diameter D is in a range of from about 1 μm to about 10 μm.

Further referring to FIGS. 1A and 1B, a buffer layer 30 is formed onto the TSV structure 28 and the first insulating interlayer 14. A portion of the buffer layer 30 remains on the protrusion portion 27 of the via structure 28. The buffer layer 30 prevents the conductive material of the TSV structure 28 from diffusing into other structures.

The buffer layer 30 is comprised of silicon nitride, silicon carbonitride (SiCN), silicon carbo-oxynitride (SiCON), and the like, alone or in a combination thereof, in an example embodiment of the present invention. The buffer layer 30 has a thickness of from about 300 Å to about 1000 Å, in an example embodiment of the present invention.

A first inter-metal dielectric layer 32 is formed on the buffer layer 30, and is comprised of a material having a low dielectric constant such as silicon oxide, carbon-doped silicon oxide, and the like for example. A plurality of conductive lines 36 is formed through the first inter-metal dielectric layer 32 and the buffer layer 30. The conductive lines 36 are an example conductive structure contacting at least a part of the outer planar portion of the TSV structure 28.

If the conductive lines 36 contact more than about 80% of the entire top surface of the TSV structure 28, then the conductive lines 36 may contact the protrusion 27. If the conductive lines 36 contact less than about 5% of the entire top surface of the TSV structure 28, such a small contact area may result in insufficient current-flow through such a contact area. Thus, the conductive lines 36 are formed to contact from about 5% to about 80% of the entire top surface of the TSV structure 28 in an example embodiment of the present invention. Some of the conductive lines 36 contact a top surface of the lower wiring 16 as illustrated in FIG. 1A.

In the example embodiment of FIG. 1B, portions of two parallel conductive lines 36 contact the outer planar portion of the TSV structure 28. In addition, no part of the conductive lines 36 contacts the center protrusion portion 27 of the TSV structure 28, according to an aspect of the present invention.

The conductive lines 36 may be formed with a barrier layer (not shown) and a metal layer comprised of a metal having a low resistance and a thermal expansion coefficient of about 1.5 times that of silicon. For example, such a metal layer is comprised of copper, aluminum, gold, indium, nickel, and the like.

A second inter-metal dielectric layer 38 is formed on the first inter-metal dielectric layer 32 and the conductive lines 36. First upper wirings 40 are formed through the second inter-metal dielectric layer 38 and are electrically connected to the conductive lines 36. Thus, the upper wirings 40 form an example linking structure for connecting the conductive lines 36. Additional insulating inter-layers (not shown) and/or wirings (not shown) may be formed.

FIGS. 2, 3, 4, 5, 6, 7, 8, and 9 are cross-sectional views illustrating steps during fabrication of the semiconductor device of FIGS. 1A and 1B, according to an example embodiment of the present invention.

Figure 2:
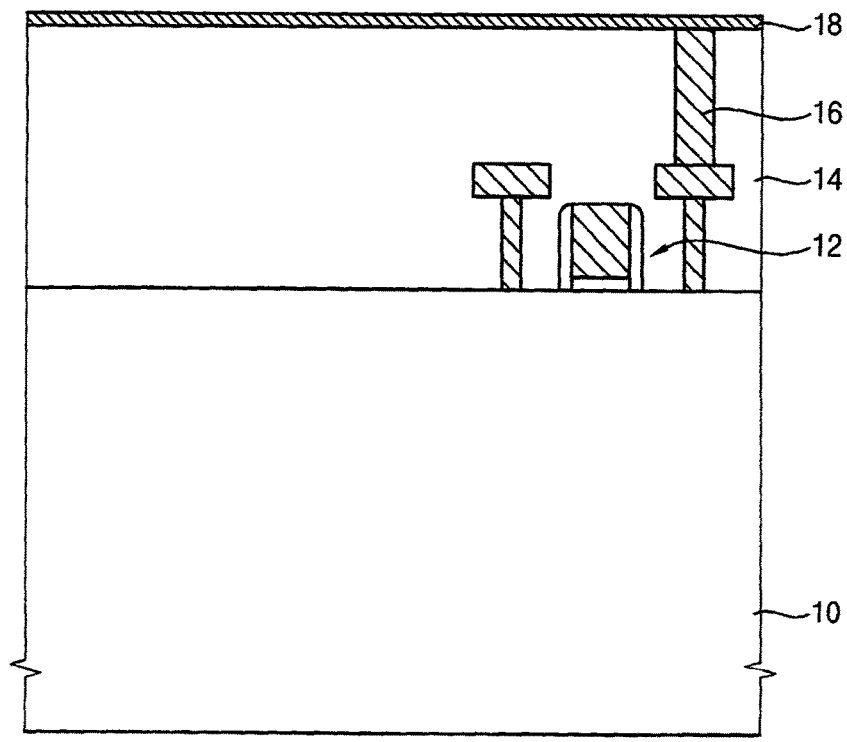
FIGS. 2, 3, 4, 5, 6, 7, 8, and 9 are cross-sectional views illustrating steps during fabrication of the semiconductor device of FIGS. 1A and 1B, according to an example embodiment of the present invention.

Referring to FIG. 2, the first circuit pattern 12 comprised of transistors, diodes, and the like for fabricating an integrated circuit is formed on the first substrate 10. The first insulating interlayer 14 is formed on the first substrate 10 to surround the first circuit pattern 12. The lower wiring 16 is formed through the first insulating interlayer 14. Thereafter, an etch stop layer 18 is formed on the first insulating interlayer 14 and the lower wiring 16. Accordingly, a front-end-of-the-line (FEOL) process is completed in FIG. 2.

Subsequently in FIG. 3, a photoresist mask (not shown) having a thickness of from about 2 μm to about 5 μm is formed on the etch stop layer 18. The etch stop layer 18, the first insulating interlayer 14, and the first substrate 10 are then patterned using such an photoresist mask to form a via hole 20 through the etch stop layer 18, the first insulating interlayer 14, and a portion of the first substrate 10. In an example embodiment of the present invention, a plurality of via holes 20 is formed for a corresponding plurality of TSV structures. Thereafter, the photoresist mask is removed to result in the structures of FIG. 3.

Figure 3:
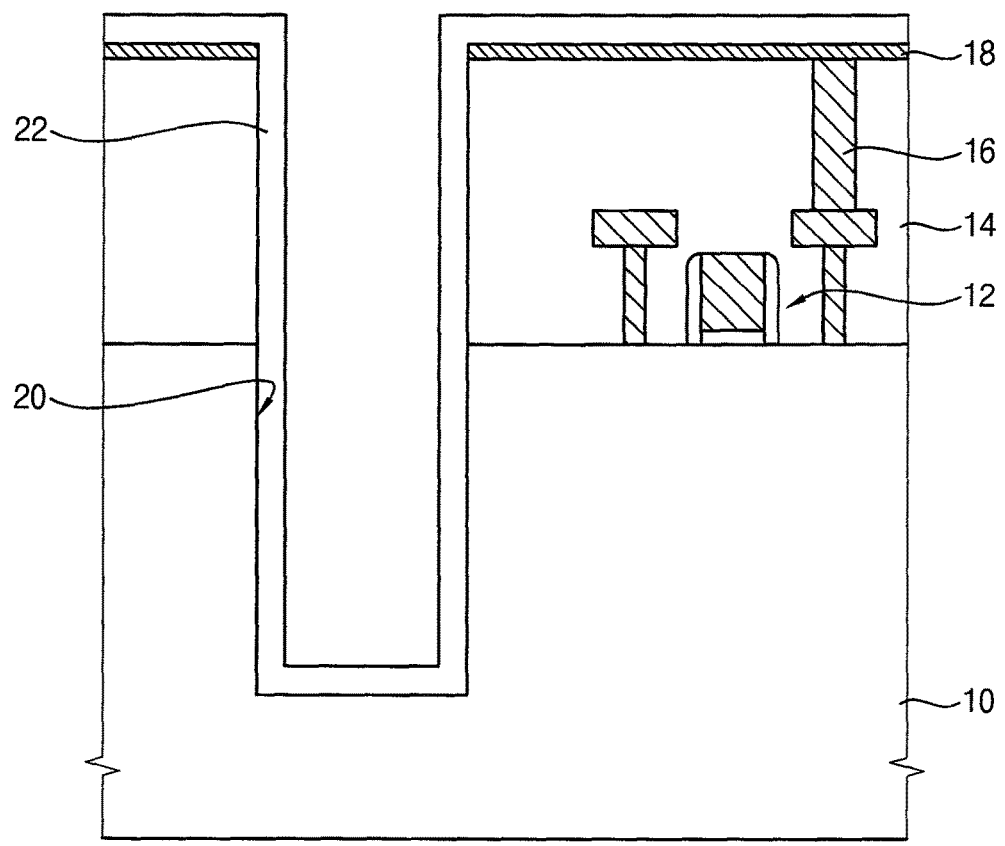

Further referring to FIG. 3, an insulation layer 22 is formed on an inner wall of the via hole 20 and on the etch stop layer 18. The insulation layer 22 is comprised of silicon oxide or carbon-doped silicon oxide in an example embodiment of the present invention. For example, the insulation layer 22 is formed using tetraethyl orthosilicate (TEOS) or ozone TEOS having good step coverage characteristics. The insulation layer 22 is formed by a plasma oxidation process or a chemical vapor deposition (CVD) process in an example embodiment of the present invention.

Figure 4:
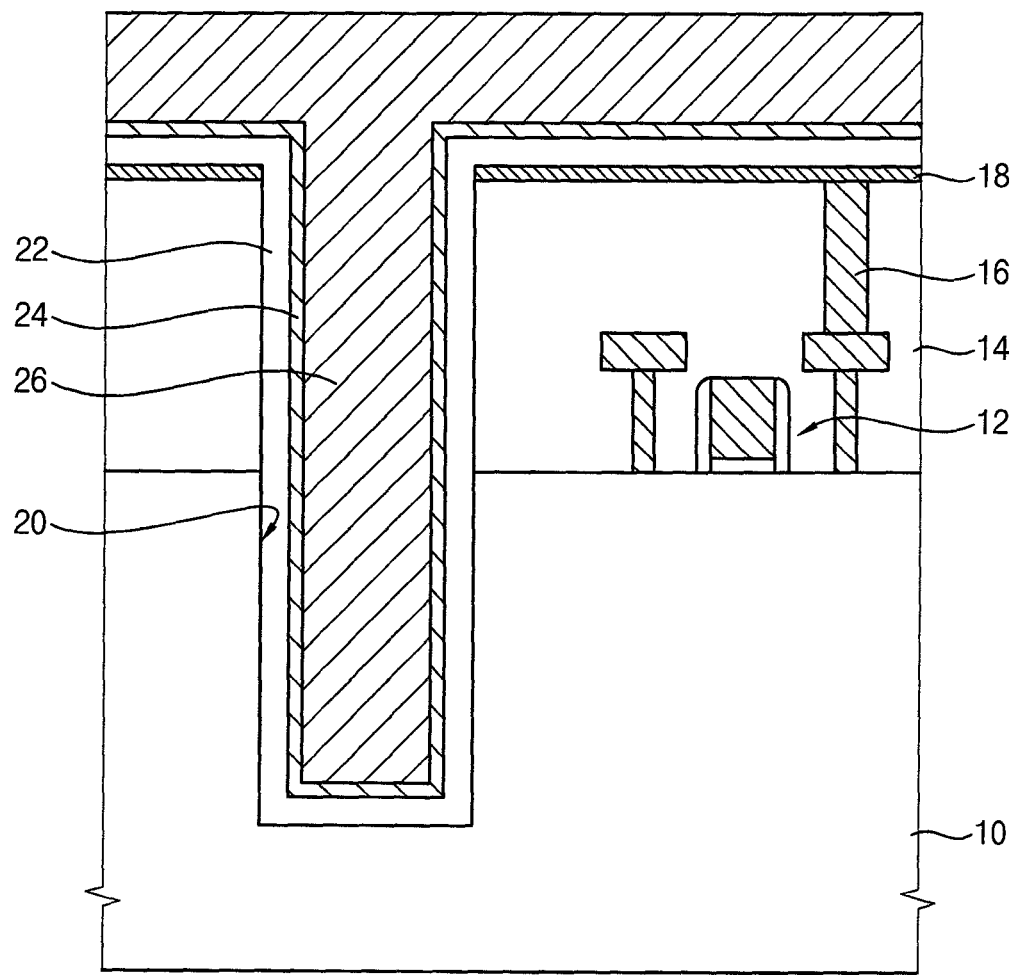

Thereafter referring to FIG. 4, a barrier layer 24 is formed on the insulation layer 22. The barrier layer 24 is comprised of a metal or a metal nitride such as tantalum, tantalum nitride, titanium, titanium nitride, ruthenium, cobalt, nickel, nickel boride, tungsten nitride, and the like, alone or in a combination thereof in an example embodiment of the present invention. The barrier layer 24 has a thickness of from about 100 Å to about 3000 Å in an example embodiment of the present invention.

A seed layer (not shown) may be formed on the barrier layer 24 for providing an electrode for forming a conductive layer 26 there-from. Such a layer is comprised of copper formed by a physical vapor deposition (PVD) process, in an example embodiment of the present invention.

The conductive layer 26 is formed from the seed layer to fill the remaining portion of the via hole 20 after the seed layer has been formed on the barrier layer 24. The conductive layer 26 is comprised of a metal having a low resistance, such as copper for example, formed by an electroplating process, an electroless plating process, an electrografting process, a PVD process, and the like. A further heat treatment process may be performed with the conductive layer 26.

The conductive layer 26 may be comprised of other metals having a thermal expansion coefficient more than about 2 times that of silicon. For example, the conductive layer 26 is comprised of aluminum, gold, indium, nickel, and the like.

Figure 5:
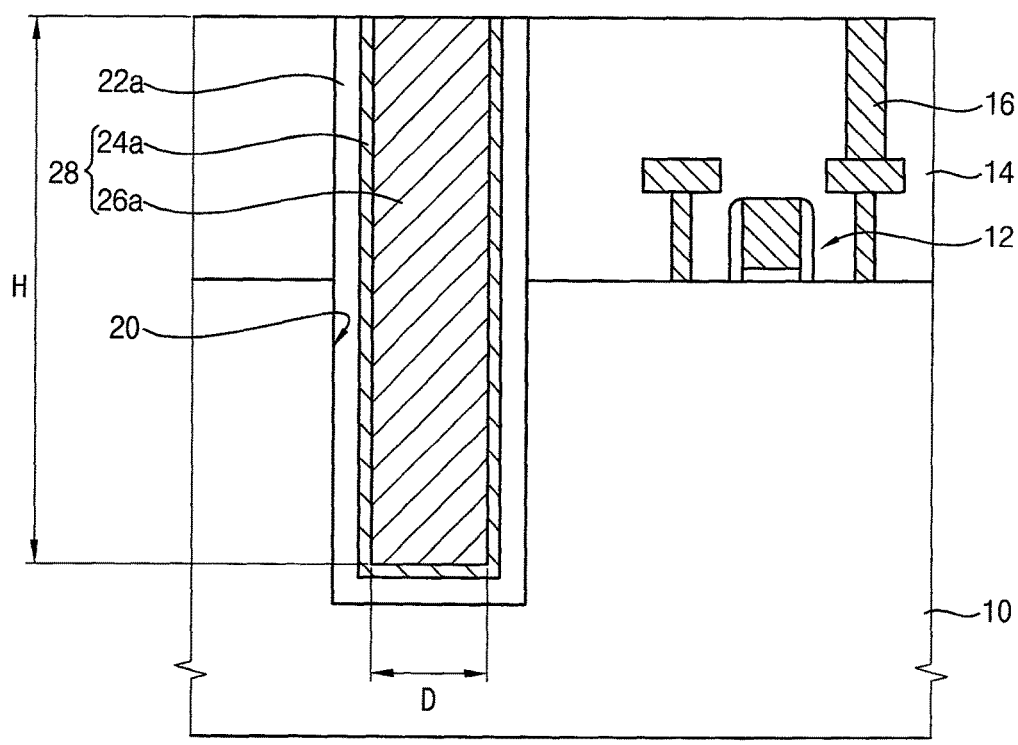

Subsequently referring to FIG. 5, upper portions of the conductive layer 26, the barrier layer 24, the insulation layer 22, and the etch stop layer 18 are planarized by a chemical mechanical polishing (CMP) process and/or an etch back process until the first insulating interlayer 14 is exposed. Such a planarization results in forming the conductive fill 26a, the barrier layer pattern 24a, and the insulation layer pattern 22a remaining within the via hole 20. The conductive fill 26a and the barrier layer pattern 24a form the TSV structure 28. The etch stop layer 18 may be completely removed in the planarization process. Alternatively, a portion of the etch stop layer 18 may remain after the planarization process.

Figure 6:
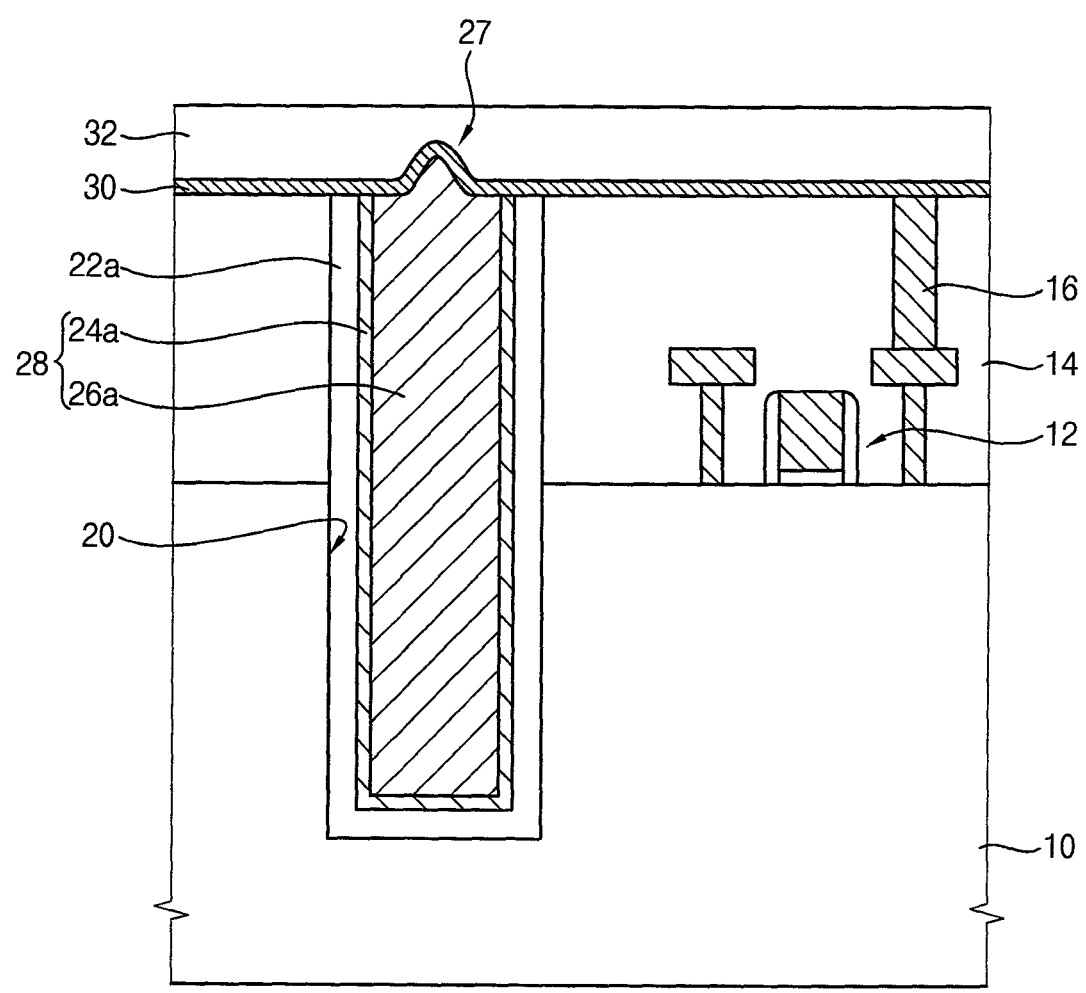

Thereafter referring to FIG. 6, a buffer layer 30 is formed on the first insulating interlayer 14 to cover the exposed top surface of the insulation layer pattern 22a, the TSV structure 28, and the lower wiring 16. The buffer layer 30 is comprised of an insulating material such as silicon nitride, silicon carbonitride (SiCN), silicon carbo-oxynitride (SiCON), and the like, alone or in a combination thereof with a thickness of from about 300 Å to about 1000 Å, in an example embodiment of the present invention. The buffer layer 30 prevents the conductive material of the TSV structure 28 from diffusing to other structures.

Subsequently referring to FIG. 7, the first inter-metal dielectric layer 32 is formed on the buffer layer 30 and the first insulating interlayer 14. The first inter-metal dielectric layer 32 is comprised of silicon oxide or carbon-doped silicon oxide, in an example embodiment of the present invention. During formation of the buffer layer 30 and the first inter-metal dielectric layer 32, the conductive fill 26a may thermally expand to result in formation of the center protrusion portion 27.

Figure 7:
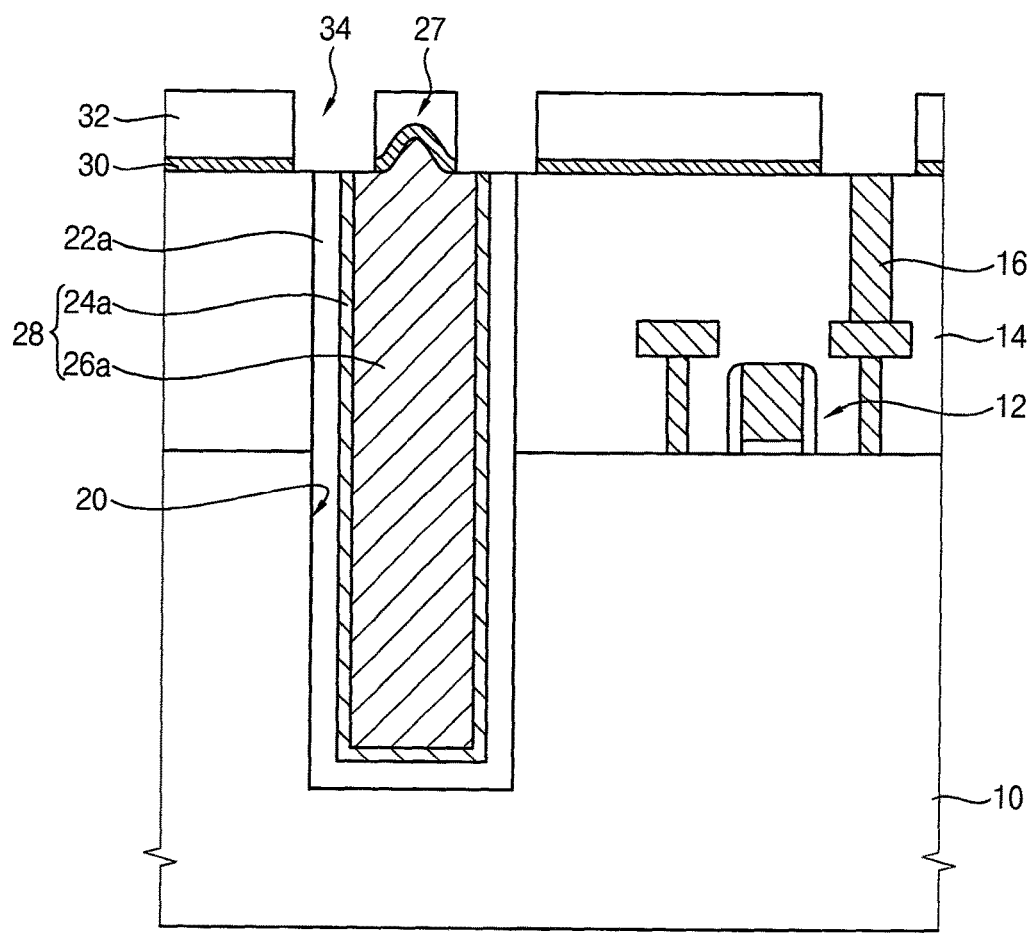

Further referring to FIG. 7, the first inter-metal dielectric layer 32 and the buffer layer 30 are patterned to form a first opening 34 exposing at least a part of the outer planar portion of the top surface of the TSV structure 28 and exposing the lower wiring 16. The first opening 34 is formed to have a line shape, in an example embodiment of the present invention. The part of the top surface of the TSV structure 28 that is exposed through the first opening 34 is from about 5% to about 80% of such a top surface of the TSV structure 28.

In an example embodiment of the present invention, two parallel first openings 34 are formed over parts of the outer planar portion of the top surface of the TSV structure 28. Accordingly, portions of the buffer layer 30 and the first inter-metal dielectric layer 32 remain over the center protrusion portion 27.

Figure 8:
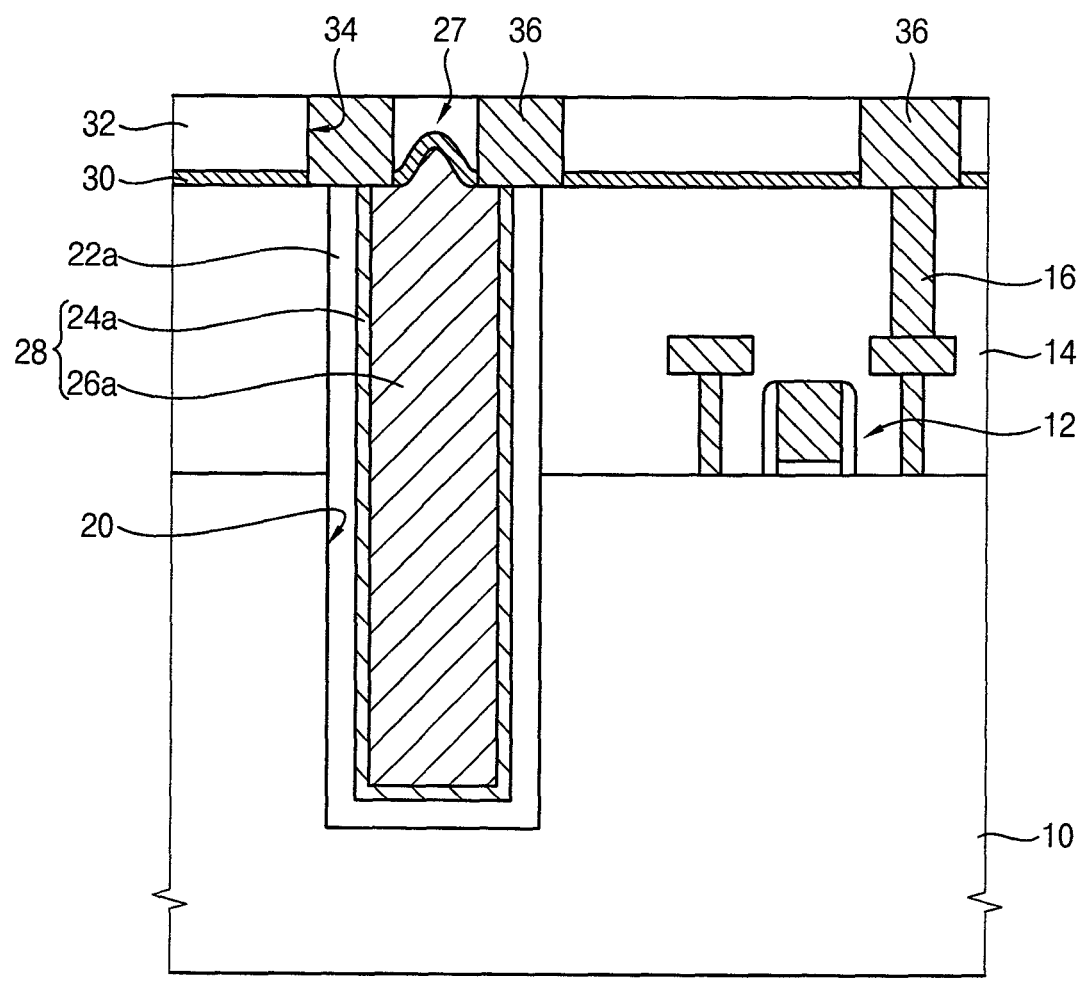

Thereafter referring to FIG. 8, a barrier layer (not shown) and a conductive material are formed into the first openings 34 and onto exposed portions of the TSV structure 28, the lower wiring 16, and the first inter-metal dielectric layer 32. Thereafter another planarization process is performed on the upper portions of such a barrier layer and such a conductive material until the first inter-metal dielectric layer 32 is exposed such that the conductive lines 36 are formed to be contained in the first openings 34.

According to an aspect of the present invention, the conductive lines 36 do not contact the center protrusion portion 27 of the TSV structure 28. The height and position of the protrusion portion 27 depends on the diameter and the depth of the via hole 20.

When the via hole 20 has a diameter and a depth smaller than about several thousand angstroms, the conductive fill 26a within the via hole 20 has a small volume such that the protrusion portion 27 is sufficiently small. For example, the lower wiring 16 has a diameter smaller than about several thousand angstroms such that the lower wiring 16 does not thermally expand significantly during the formation of the buffer layer 30 and the first inter-metal dielectric layer 32.

In contrast, the TSV structure 28 is relatively larger than other wirings such that the TSV structure 28 thermally expands significantly during formation of the buffer layer 30 and the first inter-metal dielectric layer 32. For example, the conductive fill 26a has a diameter of from about 1 μm to about 15 μm and a height of from about 10 μm to about 100 μm such that the conductive fill 26a thermally expands significantly.

When the buffer layer 30 and the first inter-metal dielectric layer 32 are formed, the sidewall of the conductive fill 26a that contacts the barrier layer pattern 24a does not expand significantly because of relatively high adhesion between such materials. Thus, just the central portion of the conductive fill 26a expands to form the center protrusion portion 27.

The adhesion between the conductive fill 26a and the barrier layer pattern 24a is low when the conductive fill 26a has a diameter of from about 15 μm to about 50 μm. In that case, the conductive fill 26a expands with the entire top surface of the conductive fill 26a being extended to form the protrusion.

Subsequently referring to FIG. 9, a second inter-metal dielectric layer 38 is formed on the first inter-metal dielectric layer 32 and the conductive lines 36. The first upper wiring 40 is formed through the second inter-metal dielectric layer 38 to be electrically connected to the conductive lines 36. In particular, second openings (not shown) are formed through the second inter-metal dielectric layer 38, and a barrier layer (not shown) and a conductive material such as copper for example are formed to fill such openings to form the first upper wiring 40.

Figure 9:
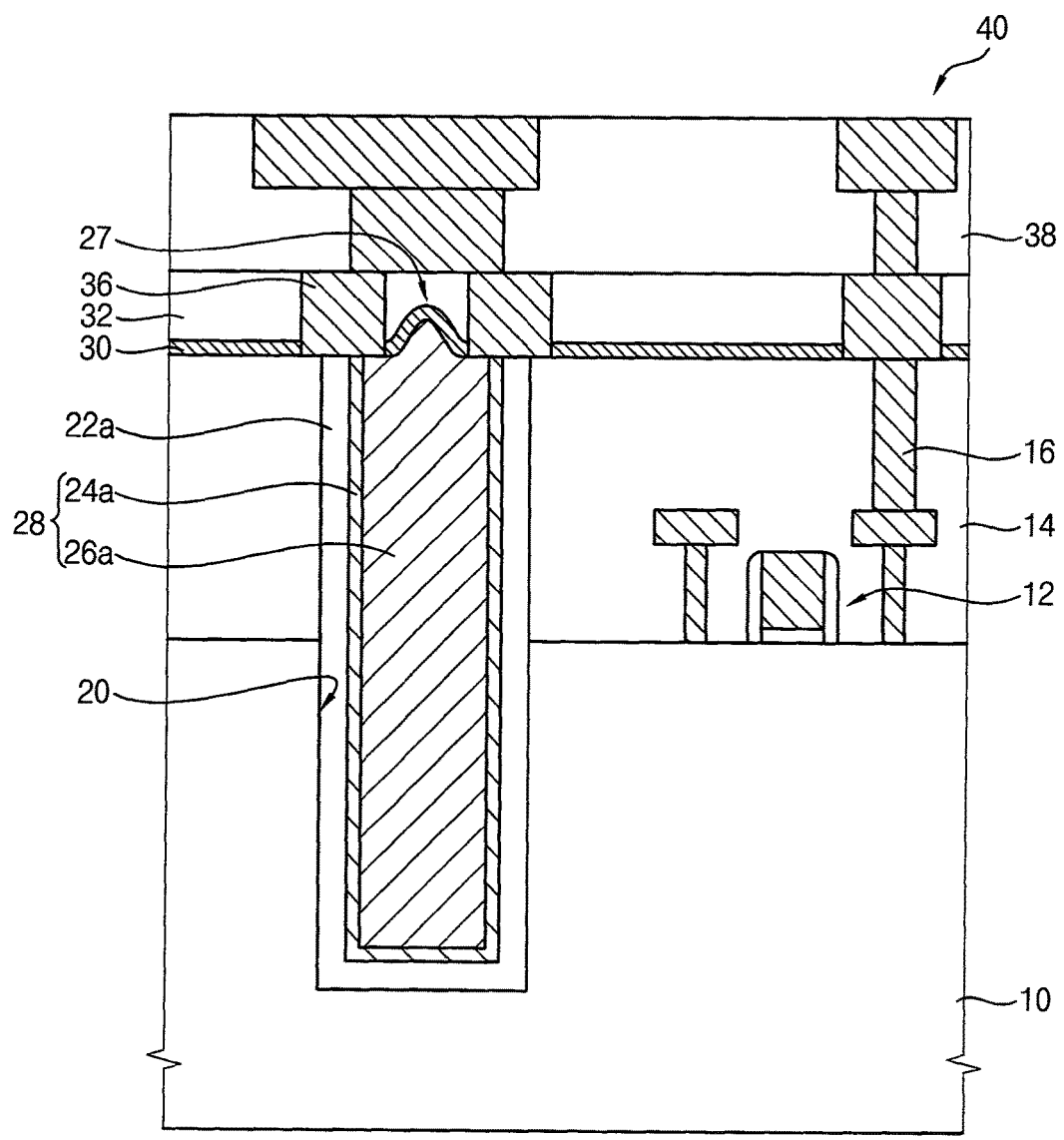

In addition, further insulating inter-layers (not shown) and additional wirings (not shown) may be formed after FIG. 9. In this manner, the conductive lines 36 as an example conductive structure are formed onto the outer planar portion of the top surface of the TSV structure 28 and not onto the center protrusion portion 27. Thus, the conductive lines 36 are formed onto the TSV structure 28 with minimized contact resistance.

Figure 32:
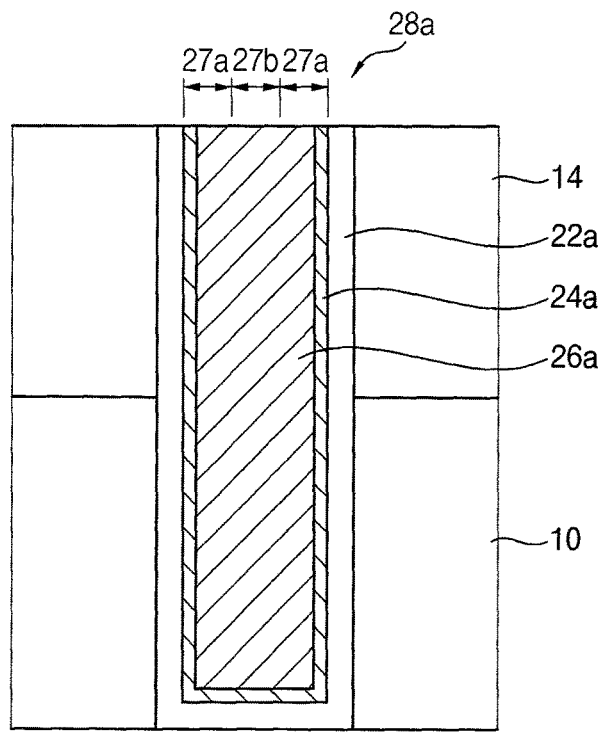
FIGS. 32 and 33 show cross-sectional views of a semiconductor device having center and outer portions that are planar with each-other, according to an example embodiment of the present invention.
Figure 33:
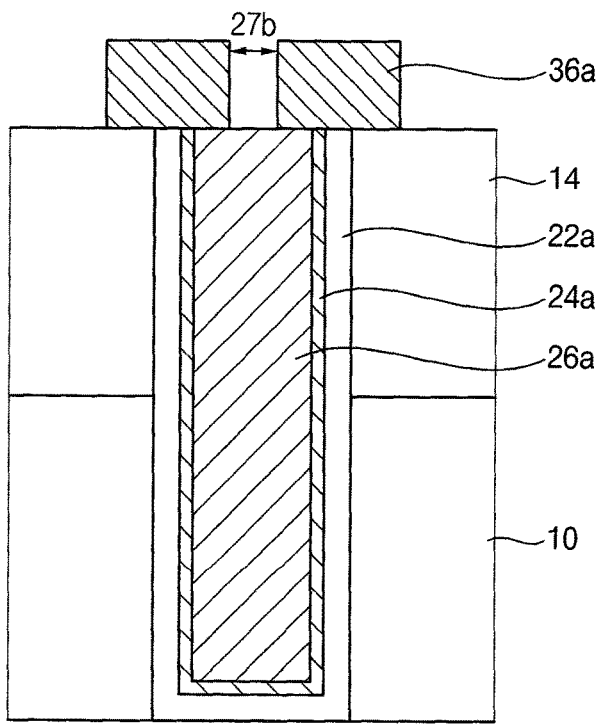

In addition referring to FIG. 32, the present invention may also be practiced with an alternative through silicon via (TSV) structure 28a formed with the insulation layer pattern 22a, the barrier layer pattern 24a, and the conductive fill 26a. In FIG. 32, the TSV structure 28a has a center portion 27b that is planar (i.e., flat) with an outer portion 27a of the top surface of the TSV structure 28a.

In FIG. 32, the outer portion 27a of the top surface of the TSV structure 28a is adjacent the insulation layer pattern 22a. The center portion 27b of the top surface of the TSV structure 28a is surrounded by the outer portion 27a. Subsequently referring to FIG. 33, the conductive lines 36a are formed onto only the outer portion 27a and not onto the center portion 27b, according to an embodiment of the present invention.

Figure 34:
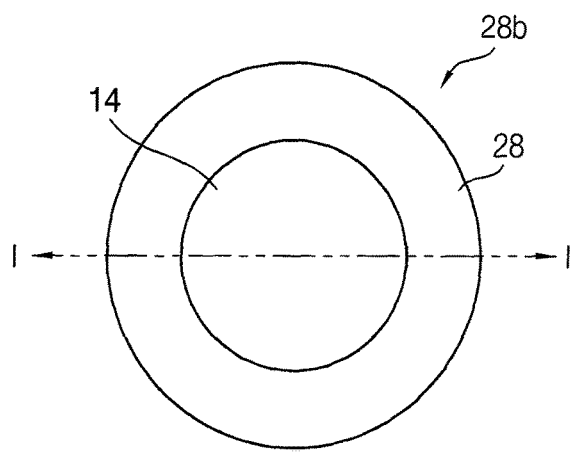
FIGS. 34 and 35 show top and cross-sectional views of a semiconductor device having an annular via structure, according to an example embodiment of the present invention.
Figure 35:
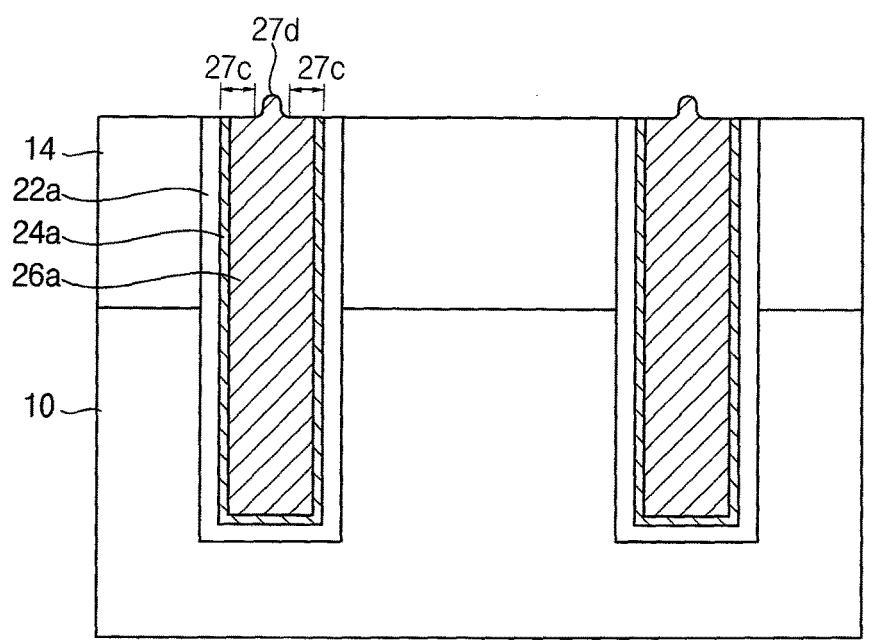

Alternatively referring to FIGS. 34 and 35, the present invention may also be practiced with an annular through silicon via (TSV) structure 28b that is formed as a ring shape. FIG. 35 is a cross-sectional view of FIG. 34 across the line I-I. The TSV structure 28b is formed with the insulation layer pattern 22a, the barrier layer pattern 24a, and the conductive fill 26a filling a via hole formed as a ring shape.

The TSV structure 28b has an outer portion 27c of the top surface of the TSV structure 28a that is adjacent the insulation layer pattern 22a. The center portion 27d of the top surface of the TSV structure 28a is surrounded by the outer portion 27c and has a protrusion of the conductive fill 26a shaped as a ring. In the example of FIGS. 34 and 35, a conductive line would be formed onto at least a part of the outer portion 27c and not onto the center protrusion portion 27d of the annular TSV structure 28b, according to an embodiment of the present invention.

Figure 10:
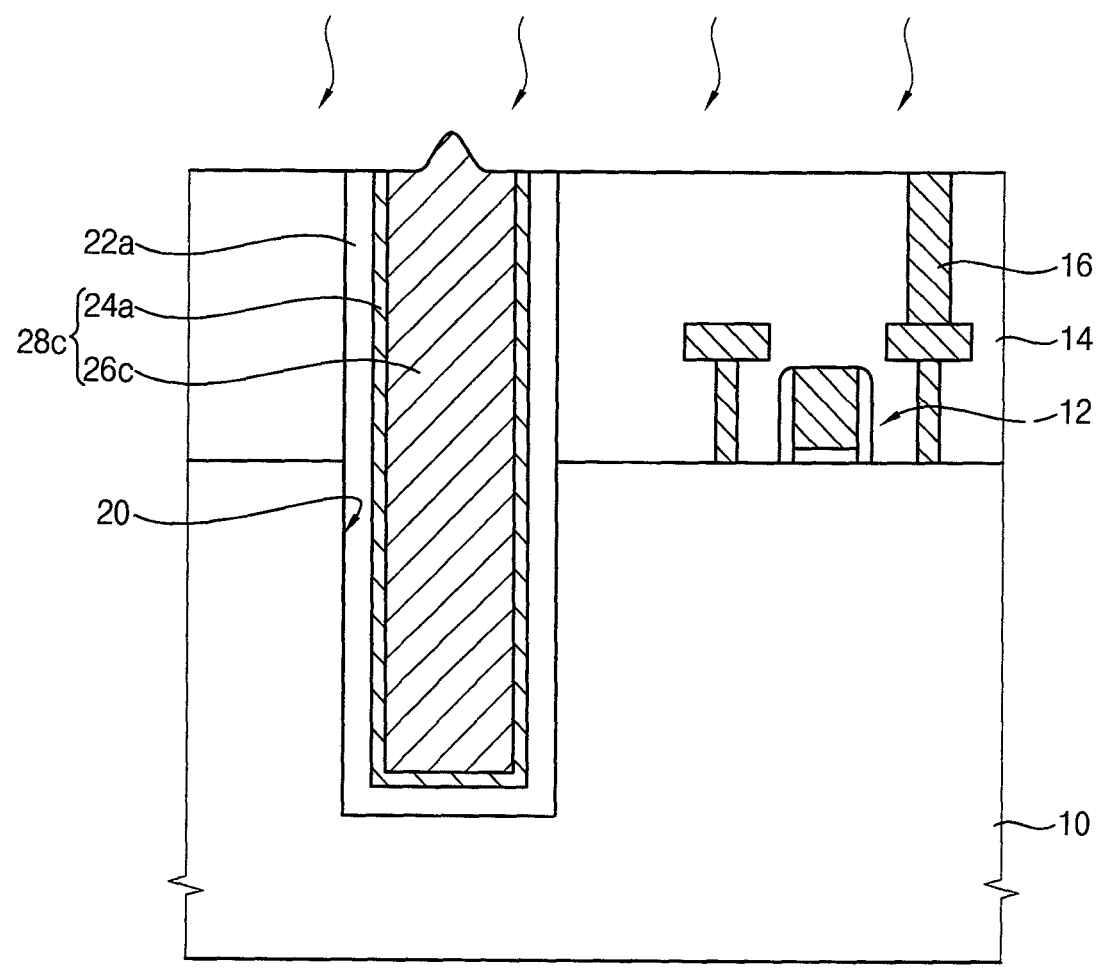
FIGS. 10 and 11 are cross-sectional views illustrating further steps during fabrication of the semiconductor device of FIGS. 1A and 1B, according to another example embodiment of the present invention.
Figure 11:
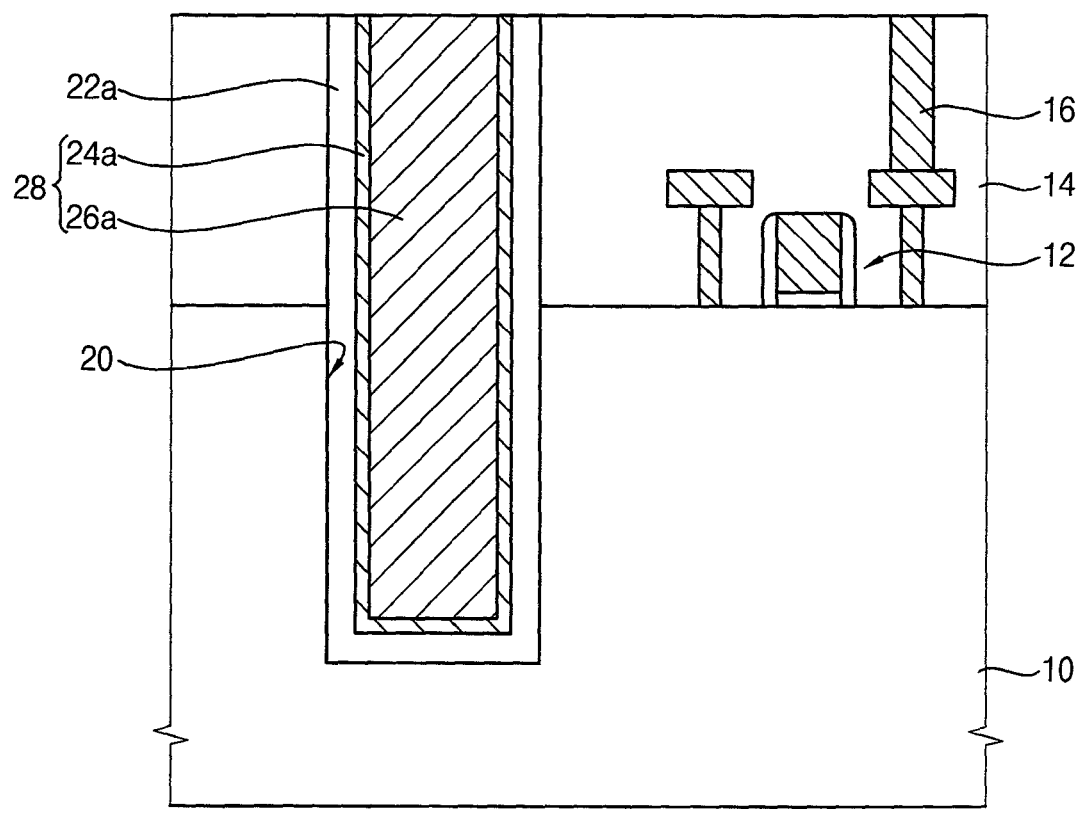

FIGS. 10 and 11 are cross-sectional views illustrating further steps during fabrication of the semiconductor device of FIGS. 1A and 1B, according to another example embodiment of the present invention. FIGS. 10 and 11 illustrate additional steps for forming the via structure of FIGS. 1, 2, 3, 4, 5, 6, 7, 8, and 9 with like reference numerals referring to like elements.

Steps illustrated is FIGS. 2, 3, 4, and 5 are performed to form the TSV structure 28 having the conductive fill 26a and the barrier layer pattern 24a. Subsequently referring to FIG. 10, a heat treatment process is performed such that an initial protrusion is formed at a top surface of the TSV structure 28 from thermal expansion of the conducive fill 26a. In FIG. 10, the TSV structure 28c has the expanded conductive fill 26c.

If such a heat treatment process is performed at a temperature of less than about 100° C., the TSV structure 28 may not be sufficiently expanded. When the heat treatment process is performed at a temperature of more than about 600° C., the TSV structure 28 may be deteriorated. Thus, the heat treatment process of FIG. 10 is performed at a temperature of from about 100° C. to about 600° C.

Thereafter referring to FIG. 11, the initial center protrusion portion of the top surface of the expanded TSV structure 28c is planarized by a CMP process and/or an etch back process to form the TSV structure 28 again having a planar top surface after removal of the initial center protrusion portion of FIG. 10. In this manner, the TSV structure 28 has already been thermally expanded such that the TSV structure 28 may not thermally expand as much during subsequent processes for forming the buffer layer 30 and the first inter-metal dielectric layer 32. After FIG. 11, the process steps of FIGS. 6, 7, 8, and 9 are performed to complete the semiconductor device.

Figure 12:
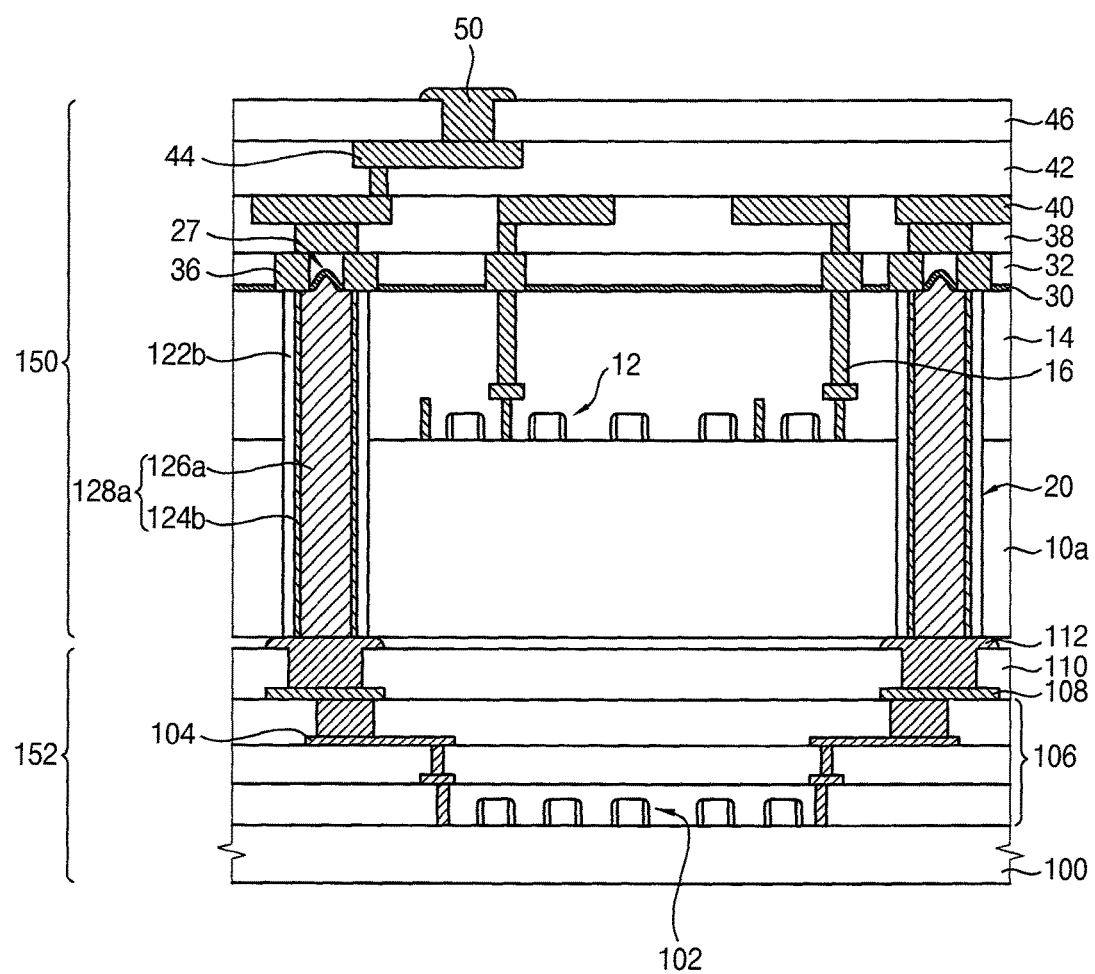
FIG. 12 is a cross-sectional view of a stacked semiconductor device having a TSV (through silicon via) structure formed similarly to FIG. 1A, according to an example embodiment of the present invention.

FIG. 12 is a cross-sectional view of a stacked semiconductor device having a TSV (through silicon via) structure formed similarly to FIG. 1A, according to an example embodiment of the present invention. Referring to FIG. 12, the stacked semiconductor device includes a first integrated circuit chip 150, a second integrated circuit chip 152, a solder 50, and a contact structure 112. The first integrated circuit chip 150 includes a memory device or a logic device fabricated therein, according to an example embodiment of the present invention. Alternatively, the first integrated chip 150 may include an imaging device fabricated therein.

The first integrated circuit chip 150 is formed substantially similar as the semiconductor device of FIGS. 1A and 1B, except that the bottom surface of a TSV structure 128a and an insulation layer pattern 122b are exposed at the bottom surface of the first substrate 10a. The TSV structure 128a and the insulation layer pattern 122b of FIG. 12 are formed similar as the TSV structure 28 and the insulation layer pattern 22a of FIGS. 1A and 1B.

Additionally, a first protection layer 46 is further formed on a second upper wiring 44 and a third inter-metal dielectric layer 42. The solder 50 is formed through the first protection layer 46.

The first integrated circuit chip 150 includes the first substrate 10a, the first circuit pattern 12, the lower wiring 16, the first insulating interlayer 14, and the insulation layer pattern 122b. Additionally, the first integrated circuit chip 150 includes the TSV structure 128a and the conductive lines 36. The TSV structure 128a is formed through the first insulating interlayer 14 and the first substrate 10a. The conductive lines 36 are formed onto the outer planar portion of the top surface of the TSV structure 128a and not onto the center protrusion portion of such a top surface, similar to FIGS. 1A and 1B. The conductive lines 36 are surrounded by the first inter-metal dielectric layer 32.

The first and second upper wirings 40 and 44 and the second and third inter-metal dielectric layers 38 and 42 are further included in the first integrated circuit chip 150. The first protection layer 46 covers the second upper wiring 44, and the solder 50 contacts the second upper wiring 44 through the first protection layer 46.

The first substrate 10a is comprised of single crystalline silicon and has a thickness of from about 10 µm to about 100 µm. The first substrate 10a has a bottom surface that is coplanar with the bottom surface of the TSV structure 128a. The present invention may also be practiced with the bottom surface of the TSV structure 128a being protruded from the bottom surface of the first substrate 10a.

The via hole 20 is formed through the first substrate 10a. The insulation layer pattern 122b is formed on the sidewall of the via hole 20. A barrier layer pattern 124b and a seed layer pattern (not shown) are formed on the insulation layer pattern 122b. A conductive fill 126a is formed to fill the remaining portion of the via hole 20 from the seed layer pattern.

The conductive fill 126a is comprised of a metal having a low resistance and a thermal expansion coefficient of about 2 times of that of silicon, in an example embodiment of the present invention. For example, the conductive fill 126a is comprised of copper, aluminum, gold, indium, nickel, and the like. In an example embodiment of the present invention, the conductive fill 126a is comprised of copper.

The TSV structure 128a is electrically connected to an electrical signal pad, a pin power signal pad, a power amp module, etc., for transmission of an electrical signal between the first and second integrated circuit chips 150 and 152. The second and third inter-metal dielectric layers 38 and 42 are sequentially formed on the first inter-metal dielectric layer 32. The conductive lines 36 and the first and second upper wirings 40 and 44 are formed through such dielectric layers 38 and 42.

The second upper wiring 44 as the highest upper wiring may be also referred to as a first pad electrode 44. The first protection layer 46 covering the second upper wiring 44 is formed on the third inter-metal dielectric layer 42. The first protection layer 46 is comprised of polyimide, according to an example embodiment of the present invention.

The solder 50 is electrically connected to the first pad electrode 44 and may contact a printed circuit board (PCB) (not shown). Alternatively, the present invention may be practiced with the first pad 44 being electrically connected to a lead frame (not shown) by wire bonding.

The second integrated chip 152 is comprised of a second substrate 100, a second circuit pattern 102, wirings 104, second insulating inter-layers 106, and a second pad electrode 108. The present invention may be practiced with the second integrated circuit chip 152 including elements substantially similar as those of the first integrated circuit chip 150, or including elements different from those of the first integrated circuit chip 150.

The second pad electrode 108 is electrically connected to the wirings 104 and is formed above the second insulating inter-layers 106. The second pad electrode 108 is electrically connected to the TSV structure 128a formed in the first substrate 10a. A second protection layer 110 is formed to cover the second pad electrode 108 above the second insulating inter-layers 106. The second protection layer 110 is comprised of polyimide, according to an example embodiment of the present invention.

The contact structure 112 is comprised of a conductive material formed through the second protection layer 110 between the second pad electrode 108 and the TSV structure 128a of the first integrated circuit chip 150. The contact structure 112 is comprised of silver solder paste in an example embodiment of the present invention.

The stacked semiconductor device includes the first and second integrated circuit chips 150 and 152 that are stacked together for being electrically connected with the TSV structure 128a. The TSV structure 128a and the conductive lines 36 have good adhesion characteristics for high speed signal transfer between the first and second integrated circuit chips 150 and 152 resulting in good electrical characteristics and high reliability of the stacked semiconductor device of FIG. 12. The semiconductor device of FIG. 12 may have other chips (not shown) that are sequentially stacked with the first and second integrated circuit chips 150 and 152 and that are electrically connected with TSV structures therein.

Figure 13:
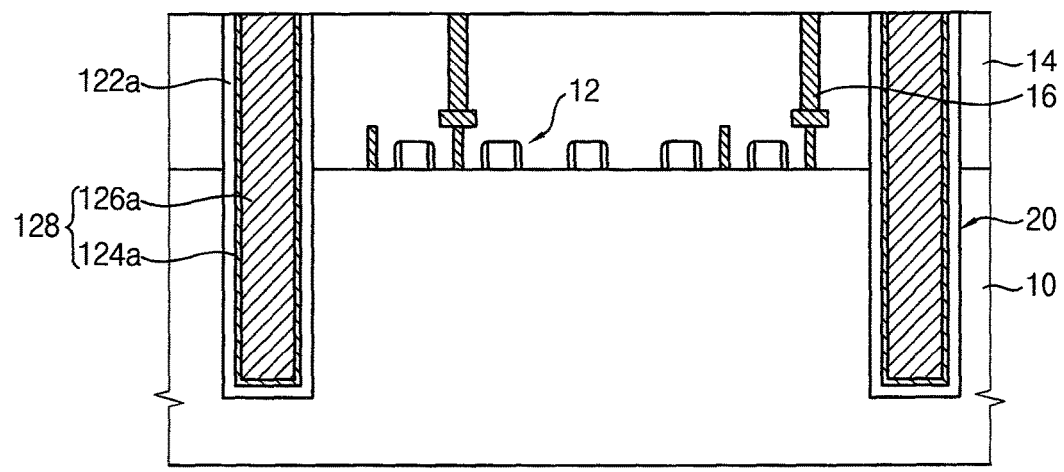
FIGS. 13, 14, 15, 16, and 17 are cross-sectional views illustrating steps during fabrication of the stacked semiconductor device of FIG. 12, according to an example embodiment of the present invention.

FIGS. 13, 14, 15, 16, and 17 are cross-sectional views illustrating steps during fabrication of the stacked semiconductor device of FIG. 12, according to an example embodiment of the present invention. Referring to FIG. 13, the first circuit pattern 12 is formed on the first substrate 10, and the first insulating interlayer 14 is formed on the first substrate 10 to surround the first circuit pattern 12. The lower wiring 16 is formed through the first insulating interlayer 14.

The first insulating interlayer 14 and the first substrate 10 are patterned to form the via holes 20 therein. The insulation layer pattern 122a and the TSV structure 128 including the barrier layer pattern 124a and the conductive fill 126a are formed in the via holes 20 similarly as in FIG. 5. The conductive fill 126a has a center protrusion portion 27 similar as in FIG. 9.

Figure 14:
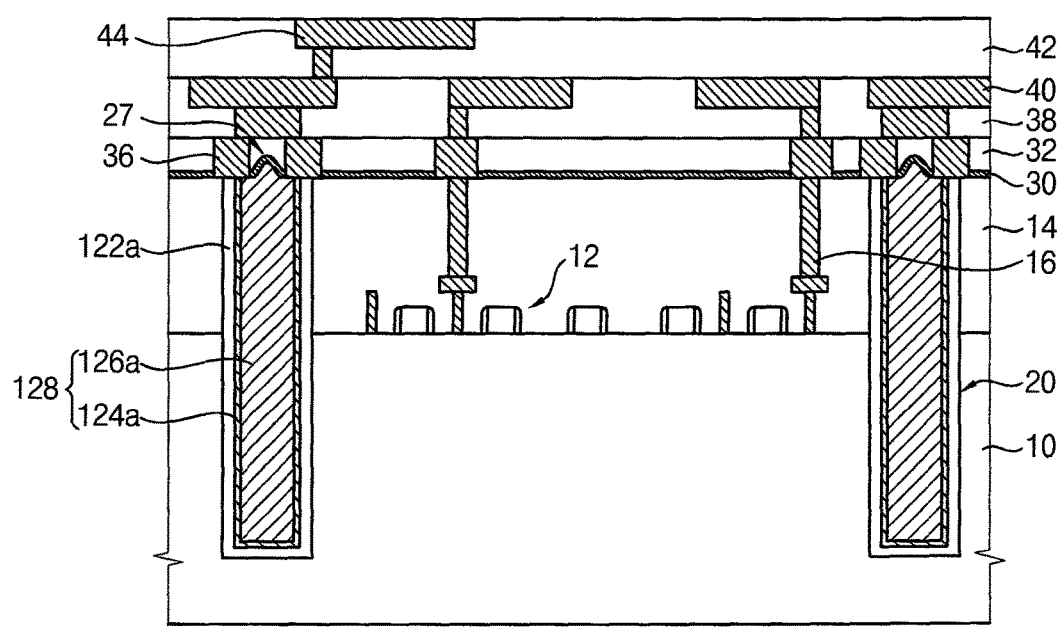

Referring to FIG. 14, the buffer layer 30 is formed on the first insulating interlayer 14 and the TSV structure 128. The first inter-metal dielectric layer 32 is formed on the buffer layer 30. The conductive line structures 36 are formed through the first inter-metal dielectric layer 32 and the buffer layer 30 to be electrically connected to the outer planar portion of the TSV structure 128 and onto the lower wiring 16.

The conductive lines 36 do not contact the center protrusion portion 27 of the TSV structure 128, similar to FIG. 9. The second and third inter-metal dielectric layers 38 and 42 and the first and second upper wirings 40 and 44 are formed on the first inter-metal dielectric layer 32 and the conductive lines 36 similarly as in FIGS. 6, 7, 8, and 9.

Figure 15:
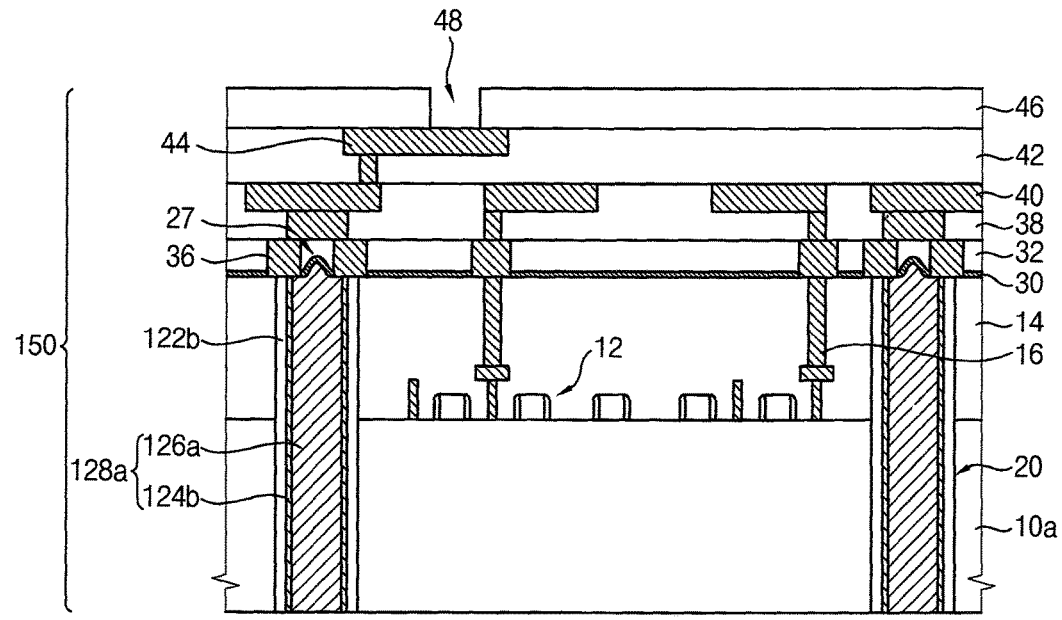
Figure 16:
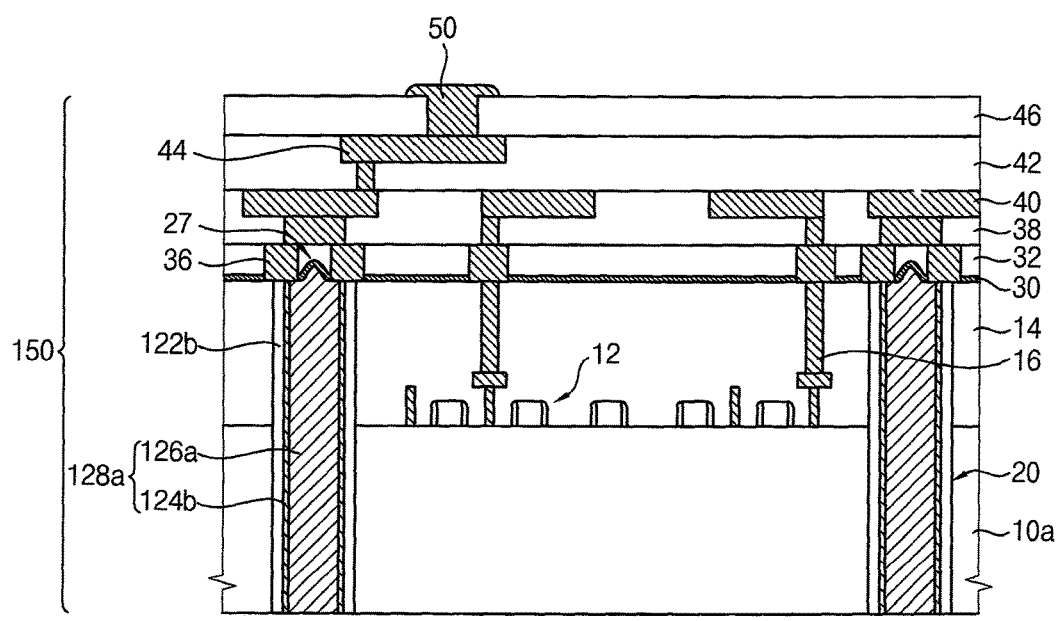

Thereafter referring to FIG. 15, the first protection layer 46 is formed on the third inter-metal dielectric layer 42 to cover the second upper wiring 44. The first protection layer 46 is comprised of polyimide, according to an example embodiment of the present invention. The first protection layer 46 is patterned to form a third opening 48 exposing the second upper wiring 44.

Bottom portions of the first substrate 10, the insulation layer pattern 122a, the barrier layer pattern 124a, and the conductive fill 126a may be removed by grinding for exposing a bottom surface of the conductive fill 126a. With such grinding, the thickness of the first substrate 10a is reduced. The remaining conductive fill 126a and the barrier layer pattern 124b define the TSV structure 128a. The insulation layer pattern 122b surrounds such a TSV structure 128a in the via hole.

With such grinding, the bottom surface of the conductive fill 126a is coplanar with the bottom surface of the first substrate 10a. However, the present invention may also be practiced with the bottom surface of the conductive fill 126a being protruded from the bottom surface of the first substrate 10a.

The insulation layer pattern 122b has a cylindrical shape on the sidewall of the via hole 20, and the barrier layer pattern 124b has a cylindrical shape on the sidewall of the insulation layer pattern 122b. The barrier layer pattern 124b surrounds the conductive fill 126a. Subsequently referring to FIG. 16, the solder 50 is formed in the third opening 48 such that the first integrated circuit chip 150 including the TSV structure 128a is completed.

Figure 17:
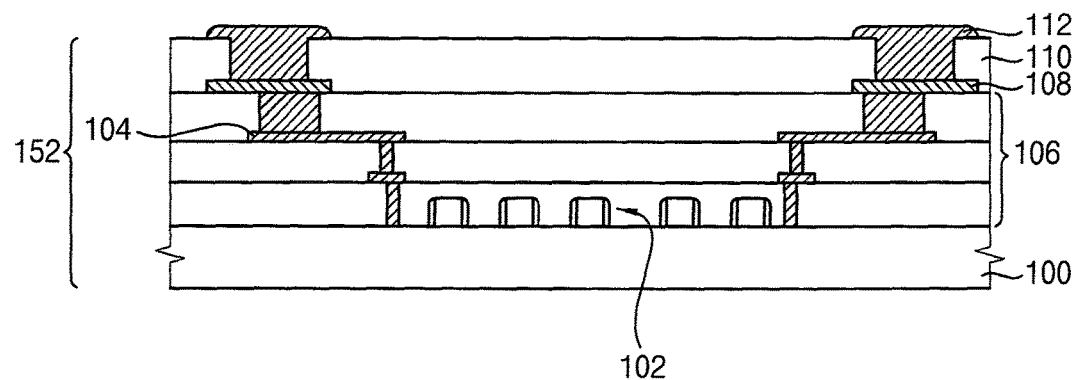

Referring to FIG. 17, the second integrated circuit chip 152 is formed with the second substrate 100 and includes the second circuit pattern 102, the wirings 104, and the plurality of second insulating inter-layers 106. The second pad electrode 108 is formed above the second insulating inter-layers 106 to be electrically connected to the wirings 104. The second pad electrode 108 is formed to be facing the TSV structure 128a of the first substrate 10a.

The second protection layer 110 is formed on the second insulating inter-layers 106 to cover the second pad electrode 108. The second protection layer 110 is patterned to form a fourth opening exposing the second pad electrode 108. The contact structure 112 is formed in the fourth opening to be electrically connected to the second pad electrode 108. Referring back to FIG. 12, the bottom surface of the TSV structure 128a of the first substrate 10a and the contact structure 112 of the second substrate 100 are attached to each other for completing the stacked semiconductor device including the first and second integrated circuit chips 150 and 152.

Figure 18A:
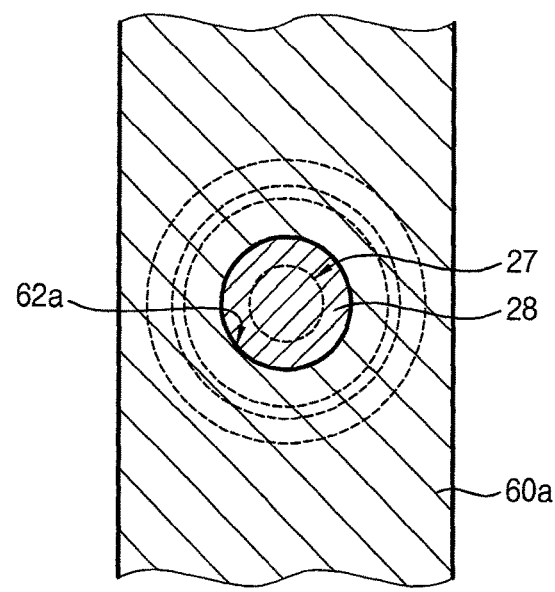
FIGS. 18A and 18B are top views for illustrating formation of a conductive structure with an opening over a via structure, according to example embodiments of the present invention.
Figure 18B:
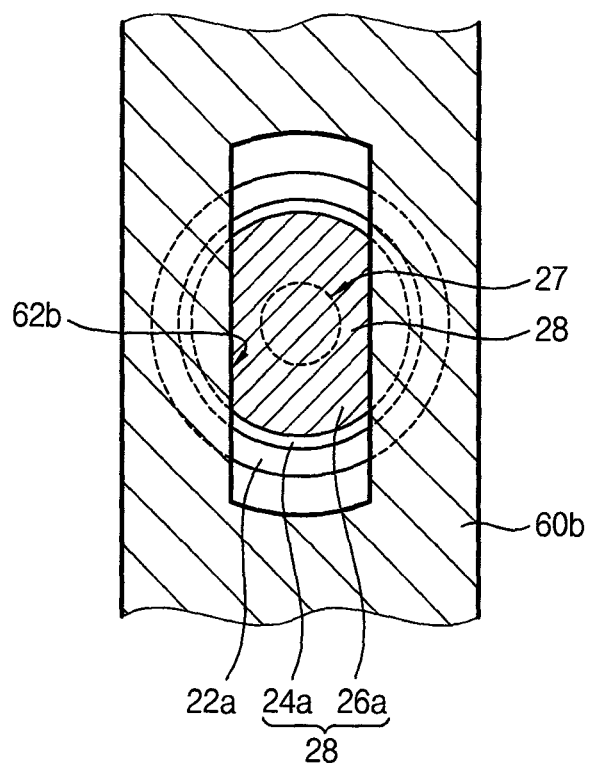

FIGS. 18A and 18B are top views for illustrating formation of a conductive structure with an opening over the via structure, according to example alternative embodiments of the present invention. The semiconductor devices of FIGS. 18A and 18B are formed similar as in FIGS. 1A and 1B, except for the shape of the conductive line structures.

Referring to FIGS. 18A and 18B, first and second conductive lines 60a and 60b have first and second openings 62a and 62b, respectively, each exposing the center protrusion portion 27 of the TSV structure 28. Each of the conductive lines 60a and 60b has a width equal to or larger than a diameter of the TSV structure 28. The conductive lines 60a and 60b do not contact the center protrusion portion 27 but contact the outer planar portion of the TSV structure 28.

The openings 62a and 62b have a size depending on the size of the protrusion portion 27. The first opening 62a has a size larger than that of the protrusion portion 27 and smaller than that of the TSV structure 28. The second opening 62b has a size larger than that of the protrusion portion 27 and further extends along a direction of the conductive line 60b. The second opening 62b also exposes parts of the top surfaces of the barrier layer pattern 24a, the insulation layer pattern 22a, and the first insulating inter-layer 14.

In either case, each of the conductive lines 60a and 60b contacts from about 5% to about 80% of the top surface of the TSV structure 28. The semiconductor devices of FIGS. 18A and 18B may be formed similarly as in FIGS. 2, 3, 4, 5, 6, and 7, except for the position and shape of the first openings 34. Furthermore, the processes of FIGS. 8 and 9 are subsequently performed to complete the semiconductor devices of FIGS. 18A and 18B.

Figure 19:
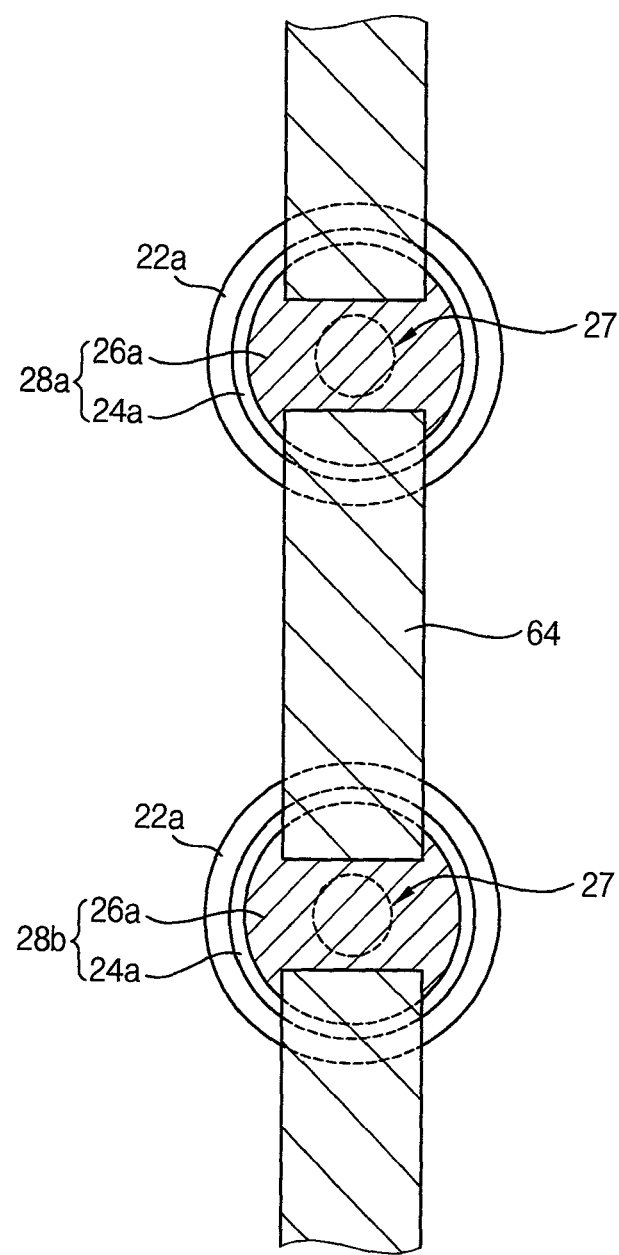
FIGS. 19 and 20 are top views for illustrating formation of multiple conductive structures onto multiple via structures, according to example embodiments of the present invention.
Figure 20:
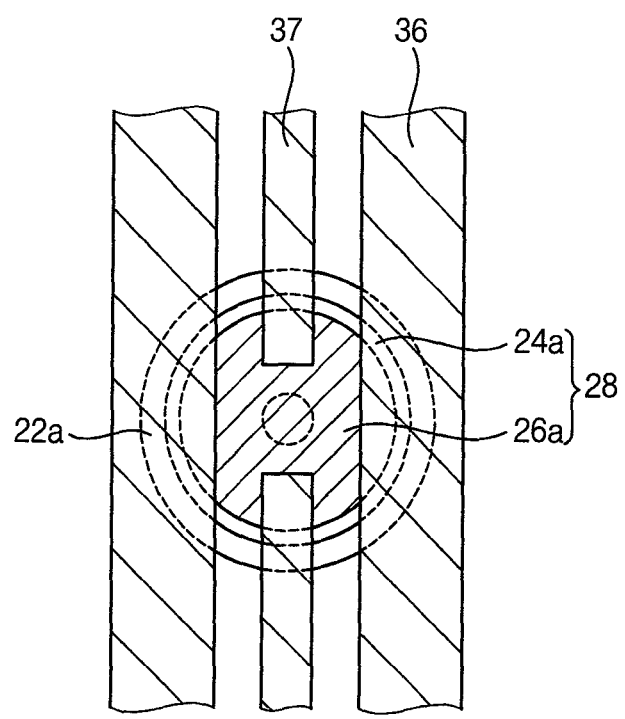

FIGS. 19 and 20 are top views for illustrating formation of multiple conductive structures onto multiple via structures, according to example embodiments of the present invention. The semiconductor device of FIG. 19 is formed similar to that of FIGS. 1A and 1B, except for the shape of the conductive lines formed onto the TSV structures.

Referring to FIG. 19, a conductive line 64 extending along a direction over multiple TSV structures 28a and 28b are divided into multiple pieces along that direction. Each piece of the conductive line 64 contacts the outer planar portions of the top surfaces of at least one of the TSV structures 28a and 28b. Such pieces of the conductive line 64 are electrically connected to each other by the TSV structures 28a and 28b.

In an example embodiment of the present invention in FIG. 19, the conductive line 64 is divided into three pieces. One piece of the conductive line 64 contacts the outer planar portions of the top surfaces of both TSV structures 28a and 28b. Another piece of the conductive line 64 contacts the outer planar portion of the top surface of the first TSV structure 28a, and the other piece of the conductive line 64 contacts the outer planar portion of the top surface of the second TSV structure 28b.

Such pieces of the conductive line 64 contact from about 5% to about 80% of the entire top surfaces of the TSV structures 28a and 28b. The semiconductor device of FIG. 19 may be formed similar to those of FIGS. 2, 3, 4, 5, 6, 7, 8, and 9, except for the position and shape of the first openings 34.

The semiconductor device of FIG. 20 is also similar to that of FIGS. 1A and 1B, except for the conductive lines formed onto the TSV structure 28. Referring to FIG. 20, two first conductive lines 36 contact first parts of the outer planar portion of the top surface of the TSV structure 28. A second conductive line 37 has two pieces extending parallel between the first conductive lines 36 over the center of the TSV structure 28. Such pieces of the second conductive line 37 contact parts of the outer planar portion of the top surface of the TSV structure 28 between the first conductive lines 36.

The semiconductor device of FIG. 20 may be formed similarly as in FIGS. 2, 3, 4, 5, 6, 7, 8, and 9, except for the position and shape of the first openings 34.

Figure 21:
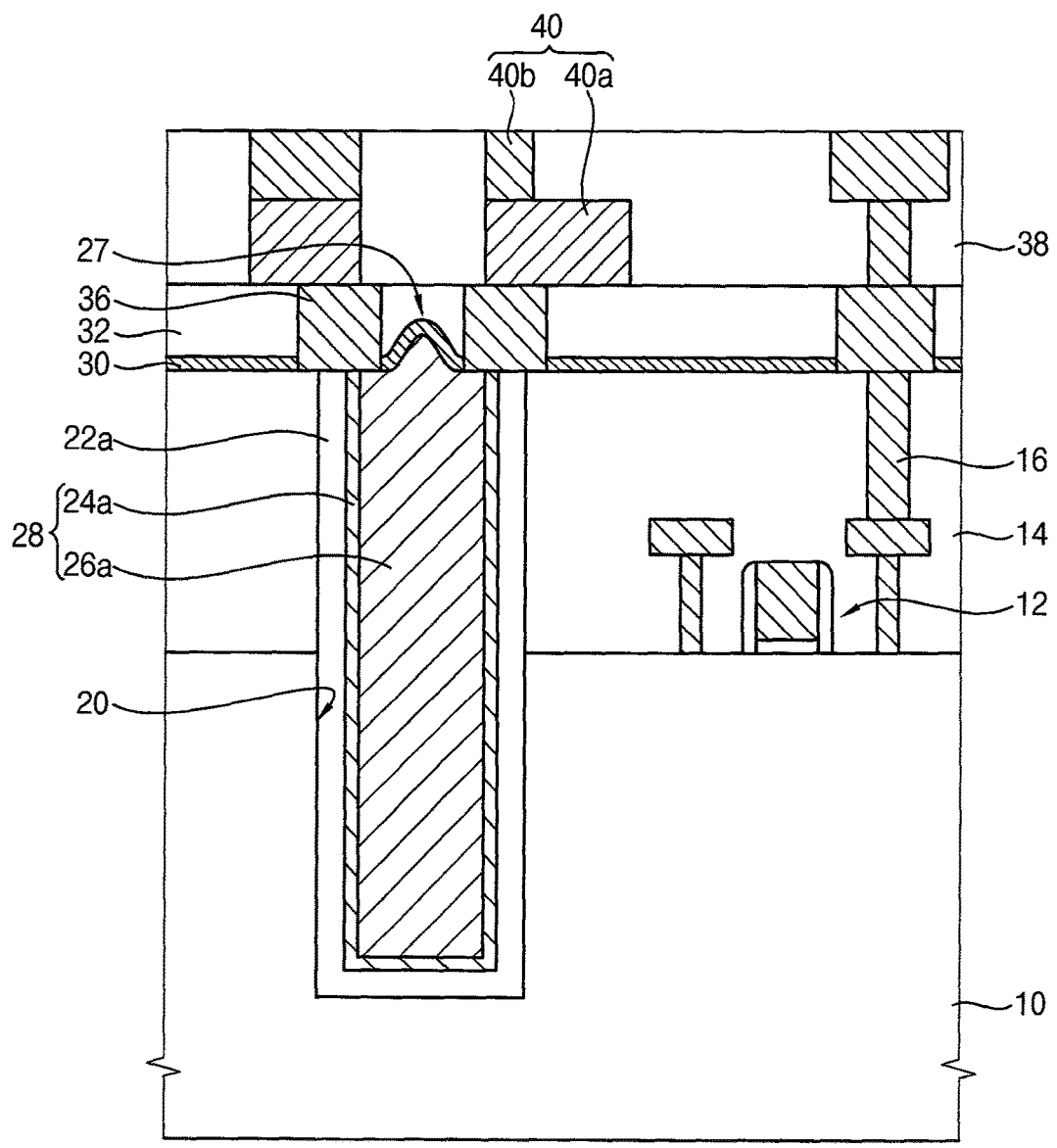
FIG. 21 is a cross-sectional view including additional conductive structures formed onto a via structure in a semiconductor device, according to an example embodiment of the present invention.

FIG. 21 is a cross-sectional view including additional conductive structures such as upper wirings formed in the semiconductor device of FIGS. 1A and 1B, according to an example embodiment of the present invention. Referring to FIG. 21, the conductive line 36 is formed onto the outer planar portion of the TSV structure 28 such as illustrated in FIG. 1A, 18A, 18B, 19, or 20.

The first inter-metal dielectric layer 32 surrounds the conductive line structure 36. The second inter-metal dielectric layer 38 is formed on the first inter-metal dielectric layer 32 and the conductive line structure 36. The upper wirings 40 are formed through the second inter-metal dielectric layer 38 with each upper wiring 40 including an upper conductive line 40a and an upper contact 40b. The upper wirings 40 are formed to not overlap the protrusion portion 27 of the TSV structure 28 in FIG. 21.

The portion of the second inter-metal dielectric layer 38 formed over the protrusion portion 27 of the TSV structure 28 may not be planar. Thus, the upper wirings 40 are formed to not overlap such a protrusion portion 27 such that the upper wirings 40 are formed to be planar. The semiconductor device of FIG. 21 is formed similarly as in FIGS. 2, 3, 4, 5, 6, 7, 8, and 9, except for the positions of the upper wirings 40.

Figure 22:
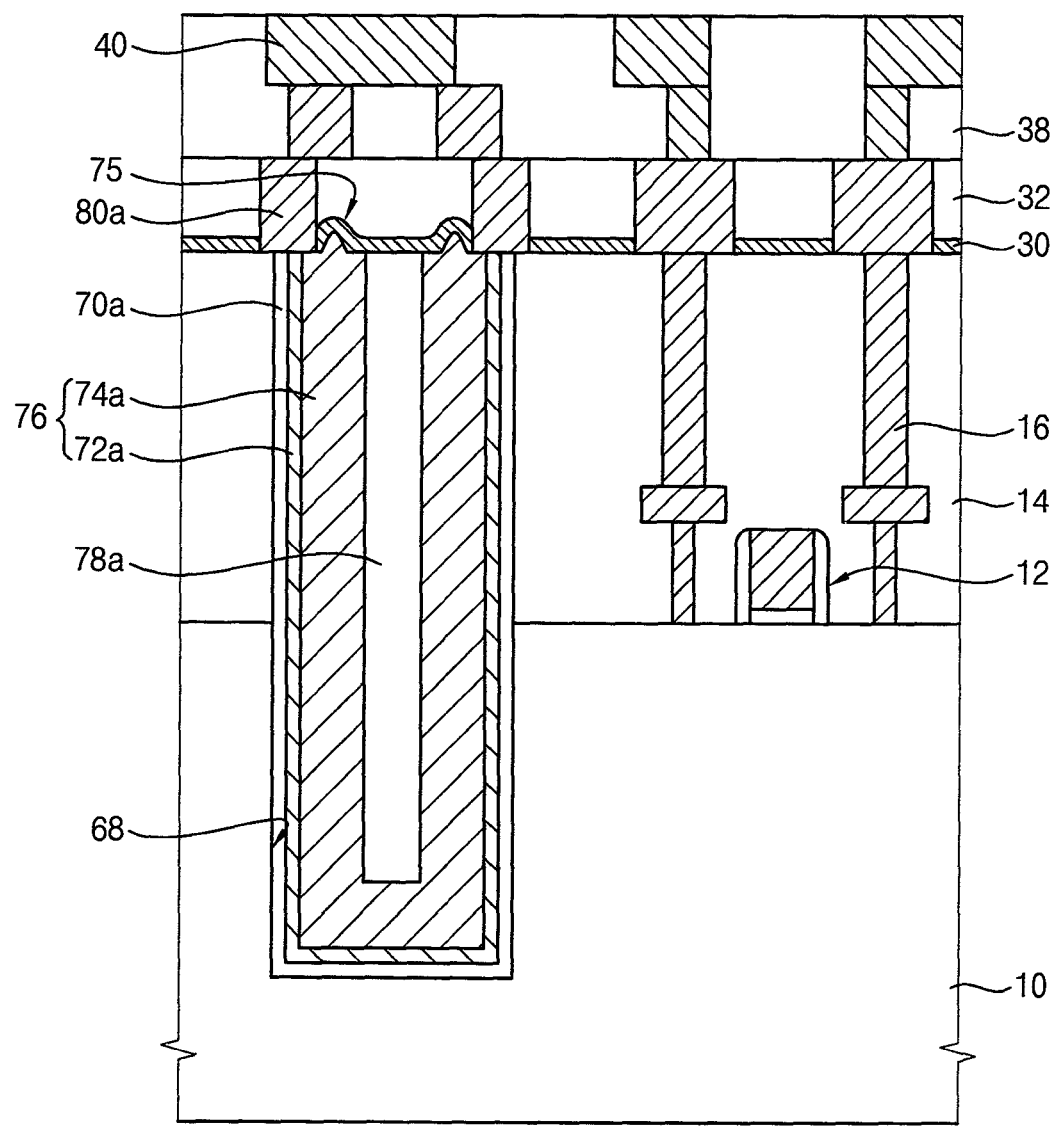
FIGS. 22 and 23 are cross-sectional and top views illustrating a semiconductor device having a via structure with a center fill, according to an example embodiment of the present invention.
Figure 23:
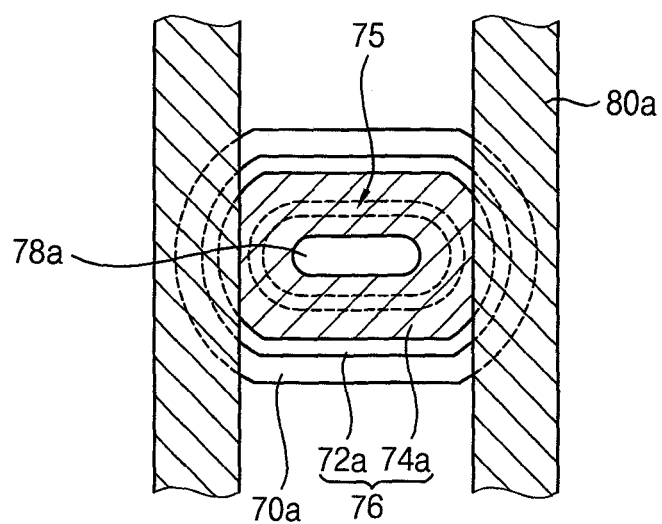

FIGS. 22 and 23 are cross-sectional and top views illustrating a semiconductor device having a via structure with a center fill, according to an alternative example embodiment of the present invention. Referring to FIGS. 22 and 23, the first circuit pattern 12 is formed on the first substrate 10 to include transistors, diodes, and the like for forming an integrated circuit.

The first insulating interlayer 14 surrounds the first circuit pattern 12 on the first substrate 10. A lower wiring 16 is formed through the first insulating interlayer 14 to connect to the first circuit pattern 12. A via hole 68 is formed through the first insulating interlayer 14 and at least a portion of the first substrate 10. The via hole 68 has a top view of an oval shape according to an example embodiment of the present invention.

An insulation layer pattern 70a is formed on an inner wall of the via hole 68, and a barrier layer pattern 72a is formed on the insulation layer pattern 70a. The barrier layer pattern 72a is comprised of a metal or a metal nitride such as tantalum, tantalum nitride, titanium, titanium nitride, ruthenium, cobalt, nickel, nickel boride, tungsten nitride, and the like, alone or in a combination thereof.

A conductive fill 74a is formed to fill the via hole 68 with the barrier layer pattern 72a surrounding the conductive fill 74a. The conductive fill 74a has a cup shape surrounding a center fill 78a. The conductive fill 74a is comprised of a metal having a low resistance and a thermal expansion coefficient of about 2 times of that of silicon such as copper, aluminum, gold, indium, nickel, and the like, alone or in a combination thereof. In an example embodiment of the present invention, the conductive fill 74a is comprised of copper. The conductive fill 74a and the barrier layer pattern 72a define a TSV structure 76.

The center fill 78a is formed in a center of the via hole 68 and is comprised of an insulating material or a conductive material according to an example embodiment of the present invention. For example, the center fill 78a is comprised of spin on glass (SOG), flowable oxide (FOX), titanium, aluminum, a porous material, and the like.

In any case, the material of the center fill 78a has a thermal expansion coefficient that is from about three times to about four times lower than a thermal expansion coefficient of the material of the conductive fill 74a. For example, the conductive fill 74a comprised of copper has a thermal expansion coefficient of 17 PPM (parts per million)/° C. In that case, the center fill 78a is comprised of a material having a lower thermal expansion coefficient of from about 3 PPM (parts per million)/° C. to about 4 PPM (parts per million)/° C.

In FIGS. 22 and 23, the conductive fill 74a includes a protrusion portion 75 having a ring shape along a center portion of the top surface of the cup-shaped conductive fill 74a. An outer portion of the top surface of the conductive fill 74a disposed near the center fill 78a and the insulation pattern 70a is planar with the top surface of the first insulating interlayer 14.

The buffer layer 30 is formed on the TSV structure 76 and the first insulating interlayer 14. A plurality of conductive lines 80a are formed to contact the outer planar portion of the top surface of the TSV structure 76 and to contact the lower wiring 16 through the first inter-metal dielectric layer 32 and the buffer layer 30. The conductive lines 80a are not formed onto and do not contact the protrusion portion 75.

In an example embodiment of FIG. 23, two parallel conductive lines 80a contact outer planar portions of the top surface of the TSV structure 76. Alternatively, more than two conductive lines 80a may be formed to contact planar portions of the top surface of the TSV structure 76. In any case, the conductive lines 80a are formed to contact from about 5% to about 80% of the entire top surface of the TSV structure 76.

The conductive lines 80a may be comprised of a barrier layer (not shown) and a conductive material such as a metal having a low resistance. In an example embodiment of the present invention, the conductive lines 80a are comprised of copper.

A second inter-metal dielectric layer 38 is formed on the first inter-metal dielectric layer 32. Upper wirings 40 are formed through the second inter-metal dielectric layer 38 to electrically connect to the conductive lines 80a. Thus, such upper wirings 40 form a linking structure for electrically connecting the conductive lines 80a. Additional insulating inter-layers (not shown) and wirings (not shown) may be further formed after FIG. 22.

Figure 24:
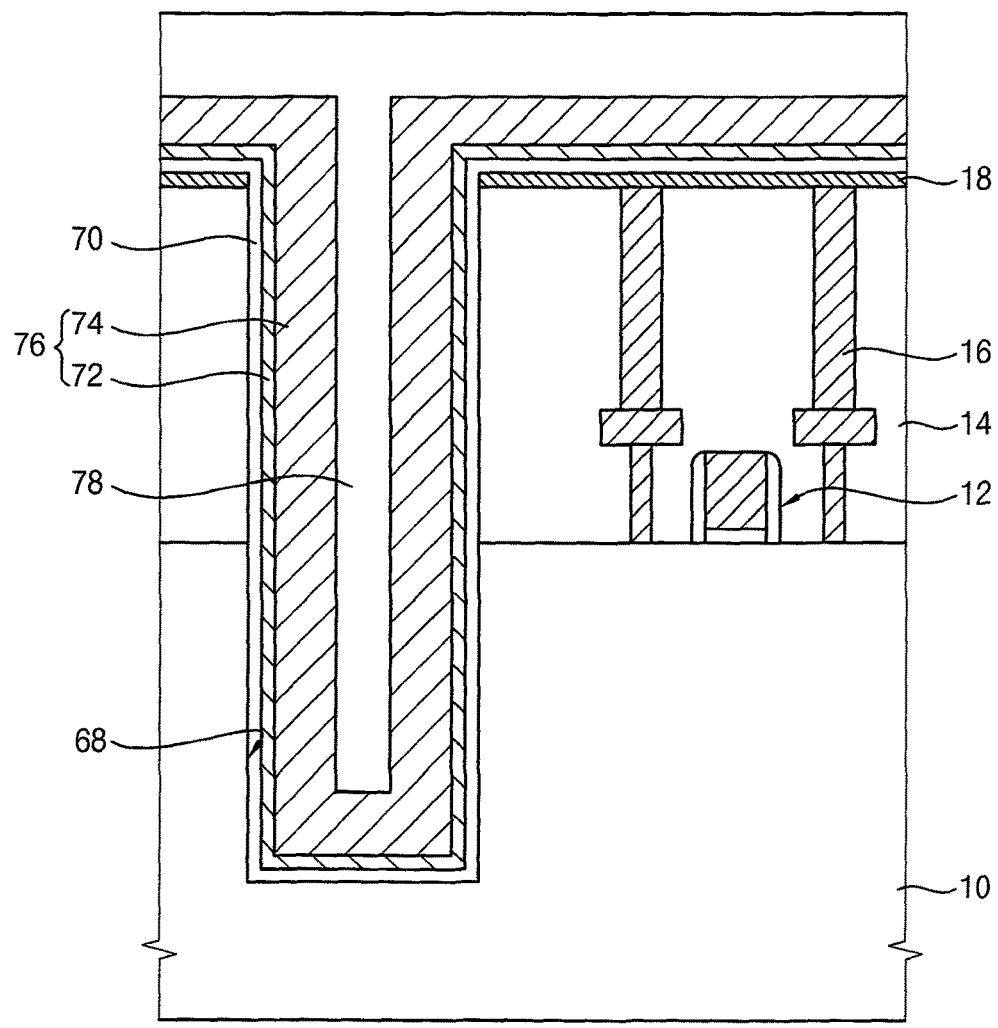
FIGS. 24 and 25 are cross-sectional views illustrating steps during fabrication of the semiconductor device of FIGS. 22 and 23, according to an example embodiment of the present invention.
Figure 25:
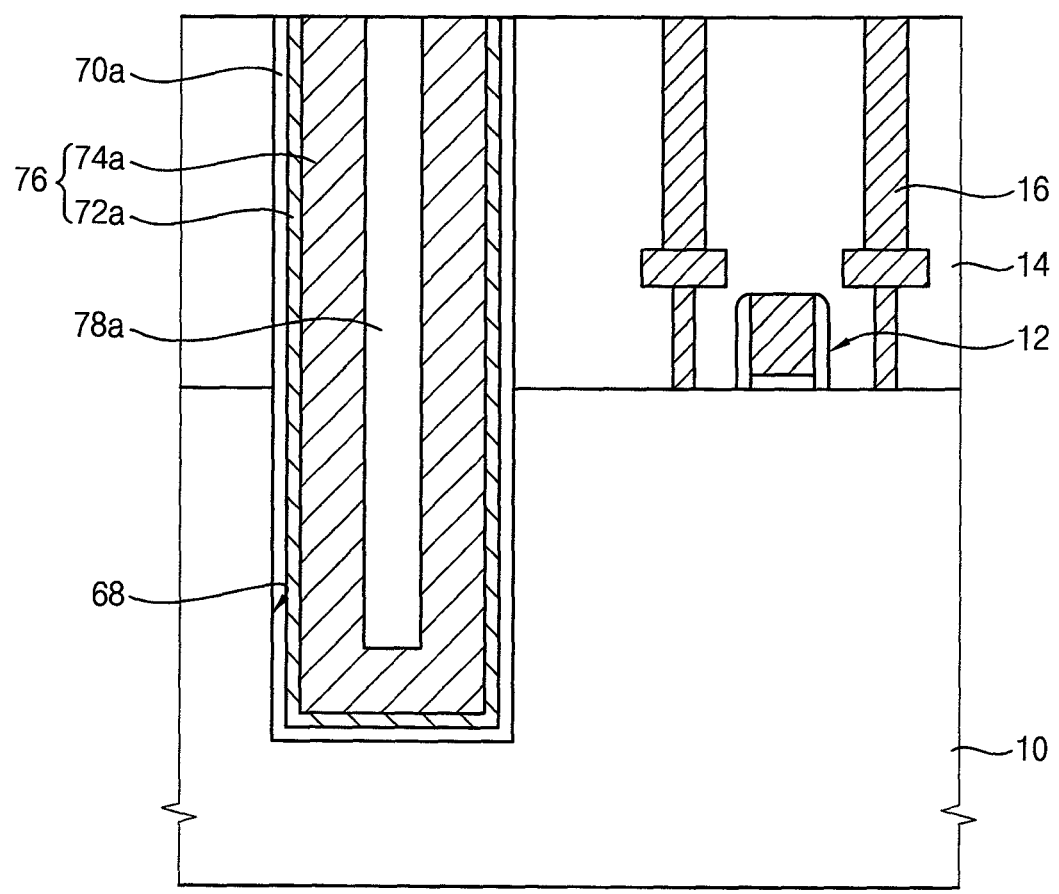

FIGS. 24 and 25 are cross-sectional views illustrating steps during fabrication of the semiconductor device of FIGS. 22 and 23, according to an example embodiment of the present invention. Process steps similar to FIGS. 2 and 3 are first performed to form the first insulating interlayer 14 on the first substrate 10. In addition, the via hole 68 is formed through the first insulating interlayer 14 and at least a portion of the first substrate 10.

The via hole 68 may have a top view of a circle or an oval shape. Furthermore, an insulation layer 70 is formed on an inner wall of the via hole 68 and an etch stop layer 18 formed on the first insulating interlayer 14 and the lower wirings 16.

Also in FIG. 24, a barrier layer 72 is formed on the insulation layer 70, and a conductive layer 74 is formed on the barrier layer 72. The conductive layer 74 is comprised of a metal having a low resistance and a thermal expansion coefficient of about 2 times that of silicon. For example, the conductive layer 74 is comprised of copper, aluminum, gold, indium, nickel, and the like, alone or in a combination thereof. In an example embodiment of the present invention, the conductive layer 74 is comprised of copper.

Further in FIG. 24, a center fill layer 78 is formed on the conductive layer 74 for filling the remaining portion of the via hole 68. The center fill layer 78 is comprised of SOG, FOX, titanium, aluminum, a porous material, and the like. In an example embodiment of the present invention, the conductive layer 74 is comprised of copper having a thermal expansion coefficient of 17 PPM (parts per million)/° C. In that case, the center fill layer 78 is comprised of a material having a lower thermal expansion coefficient of from about 3 PPM (parts per million)/° C. to about 4 PPM (parts per million)/° C. Thus, the center fill layer 78 buffers the thermal expansion of the conductive layer 74 for minimized height of the protrusion portion 75 that is formed in a ring shape.

Subsequently in FIG. 25, upper portions of the center fill layer 78, the conductive layer 74, the barrier layer 72, the insulation layer 70, and the etch stop layer 18 are planarized until a top surface of the first insulating interlayer 14 is exposed. In this manner, the TSV structure 76 is formed to be contained in the via hole 68. The process steps of FIGS. 6, 7, 8, and 9 may then be performed after FIG. 25 to complete the semiconductor device of FIG. 22.

Figure 26:
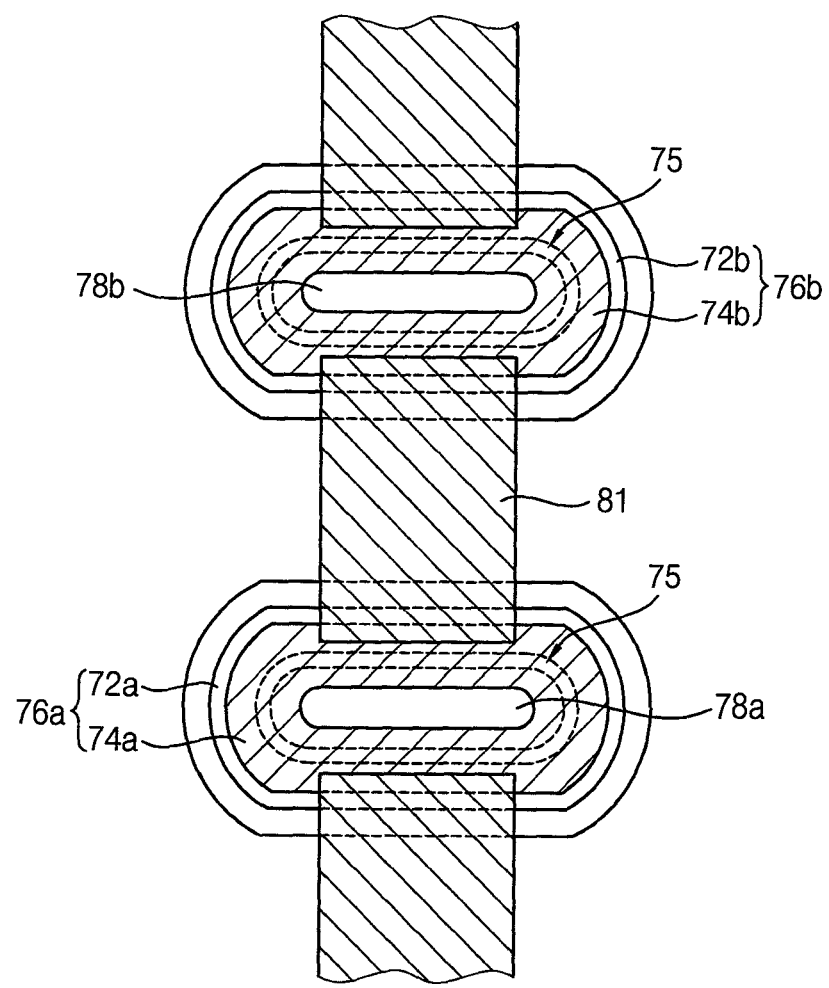
FIGS. 26, 27, and 28 are top views of a semiconductor device having multiple conductive structures formed onto multiple via structures, according to example embodiments of the present invention.
Figure 27:
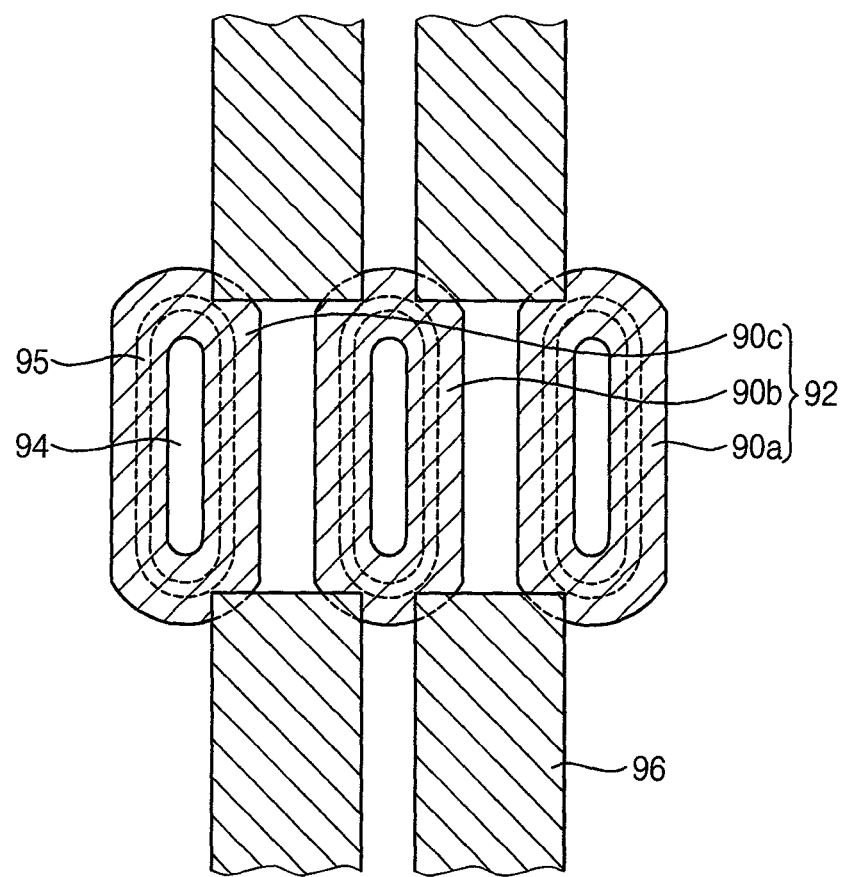
Figure 28:
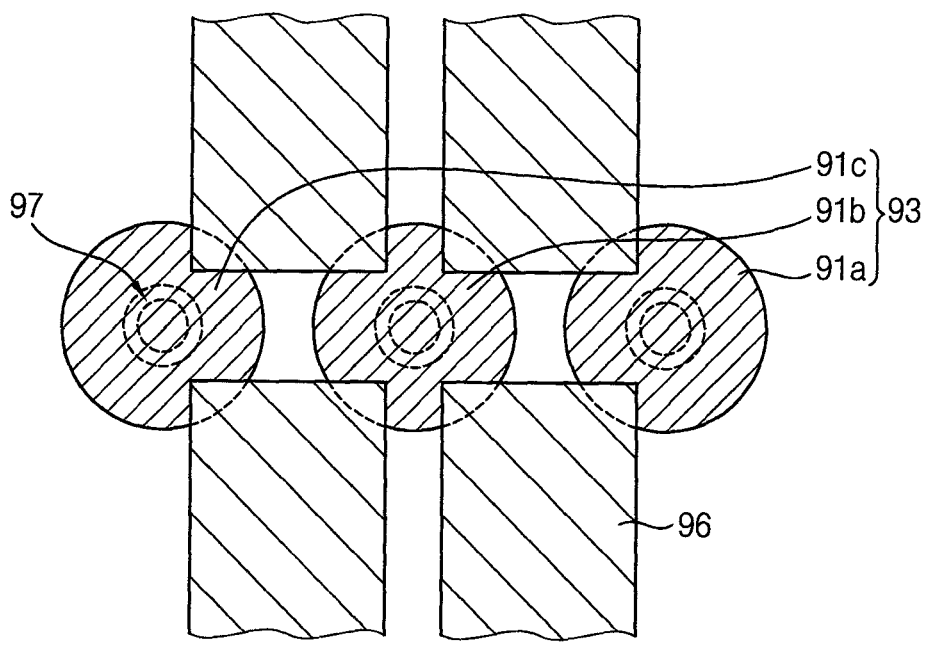

FIGS. 26, 27, and 28 are top views of a semiconductor device having multiple conductive structures formed onto multiple via structures, according to example embodiments of the present invention. The semiconductor device of FIG. 26 is similar to the semiconductor device of FIG. 19, except for TSV structures 76a and 76b formed in a cup shape to surround the center fills 78a and 78b, respectively, similarly as described in reference to FIG. 25.

Referring to FIG. 26, a conductive line 81 is divided into multiple pieces that extend along a plurality of the TSV structures 76a and 76b. Each of the TSV structures 76a and 76b is formed similarly as described in reference to FIG. 25. Each of the pieces of the conductive line 81 contacts the outer planar portion of at least one of the TSV structures 76a and 76b. Such pieces of the conductive line 81 are electrically connected by the TSV structures 76a and 76b.

In the example embodiment of FIG. 26, the conductive line 81 is divided into three pieces. One piece of the conductive line 81 contacts portions of the outer planar surface of the top surfaces of the first and second TSV structures 76a and 76b. Another piece of the conductive line 81 contacts a portion of the outer planar surface of the top surface of the first TSV structure 76a. The other piece of the conductive line 81 contacts a portion of the outer planar surface of the top surface of the second TSV structure 76b.

The first TSV structure 76a includes a first conductive fill 74a and a first barrier layer pattern 72a. The second TSV structure 76b includes a second conductive fill 74b and a second barrier layer pattern 72b. Each of the first and second conductive fills 74a and 74b has a respective center protrusion portion 27 in the shape of a ring.

The first center fill 78a is surrounded by the first conductive fill 74a, and the second center fill 78b is surrounded by the second conductive fill 74b. The semiconductor device of FIG. 26 may be manufactured by process steps similar to FIGS. 24 and 25, except for the position and shape of the conductive line structure 81.

FIG. 27 is a top view of a semiconductor device according to another example embodiment of the present invention. For convenience of illustration and description, only TSV structures and conductive lines are shown in FIG. 27. However, additional structures similar to FIG. 22 may also be formed for the semiconductor device of FIG. 27.

In FIG. 27, the semiconductor device includes a plurality of TSV structures 90a, 90b, and 90c, each being formed similar to the TSV structure 76 of FIG. 22. The three TSV structures 90a, 90b, and 90c together form a larger TSV structure 92. For example, when a TSV structure having a larger diameter is desired, forming such a larger TSV structure with a large diameter may be difficult and result in a protrusion region with undesired height. Thus, the plurality of TSV structures 90a, 90b, and 90c are formed with relatively smaller diameter to together form the larger TSV structure 92. Each of the TSV structures 90a, 90b, and 90c with relatively smaller diameter has minimized height of the protrusion portion.

Each of the TSV structures 90a, 90b, and 90c surrounds a respective center fill 94 and includes a respective protrusion region 95 having a ring shape. Each of a plurality of conductive line structures 96 is formed onto and contacts the outer planar portions of the top surfaces of a respective set of at least two of the TSV structures 90a, 90b, and 90c. Each of the conductive line structures 96 does not contact the protrusion region 95 of the TSV structures 90a, 90b, and 90c.

The conductive lines 96 extend parallel with each other and are divided into multiple pieces as illustrated in FIG. 27. Such pieces of the conductive lines 96 are electrically connected to each other by the TSV structure 92. The conductive lines 96 are formed onto and contact from about 5% to about 80% of the entire top surfaces of the TSV structures 90a, 90b, and 90c.

FIG. 28 is a top view of a semiconductor device according to another example embodiment of the present invention. For convenience of illustration and description, only TSV structures and conductive lines are shown in FIG. 28. However, additional structures similar to FIG. 22 may also be formed for the semiconductor device of FIG. 28. Additionally, the semiconductor device of FIG. 28 is similar to FIG. 27, except for the shape of the TSV structure 93.

The semiconductor device in FIG. 28 includes a plurality of TSV structures 91a, 91b, and 91c, each being formed similar to the TSV structure 28 of FIGS. 1A and 1B. The three smaller TSV structures 91a, 91b, and 91c together form a larger TSV structure 93. Each of the TSV structures 91a, 91b, and 91c include a respective center protrusion portion 97.

Further referring to FIG. 28, a plurality of conductive line structures 96 are formed onto and contact parts of the outer planar portions of a set of at least two of the TSV structures 91a, 91b, and 91c. The conductive lines 96 do not contact the protrusion portions 97 of the TSV structures 91a, 91b, and 91c. The conductive lines 96 are formed to extend along lines between the TSV structures 91a, 91b, and 91c and are parallel to each other.

The conductive lines 96 are divided into multiple pieces, and each piece is formed onto and contacts parts of the outer planar portions of a set of at least two of the TSV structures 91a, 91b, and 91c. Such pieces of the conductive lines 96 are electrically connected to each other by the TSV structure 93. The conductive lines 96 are formed onto and contact from about 5% to about 80% of the entire top surfaces of the TSV structures 91a, 91b, and 91c. In the semiconductor device of FIGS. 26, 27, and 28, upper wirings (not shown) may also be formed as a linking structure for connecting together the conductive line pieces 81 or 96.

Figure 29:
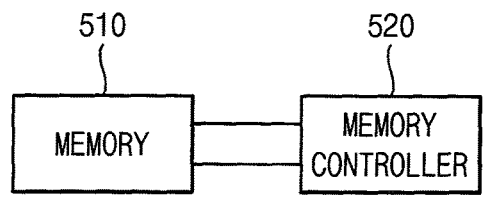
FIGS. 29, 30, and 31 show block diagrams of systems, each having a stacked semiconductor device, according to example embodiments of the present invention.

FIG. 29 is a block diagram of a system having a stacked semiconductor device such as shown in FIG. 12 for example according to an example embodiment of the present invention. Referring to FIG. 29, the system includes a controller 520 and a memory 510. The memory 510 is a DRAM device or a flash memory device being implemented as the stacked semiconductor device such as shown in FIG. 12 for example. The memory controller 520 provides an input signal for controlling operation of the memory 510.

Figure 30:
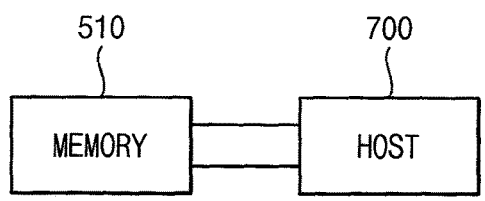

FIG. 30 is a block diagram illustrating a system having a stacked semiconductor device such as shown in FIG. 12 for example according to another example embodiment of the present invention. Referring to FIG. 30, the system includes a host 700 and a memory 510. The memory 510 is a DRAM device or a flash memory device being implemented as the stacked semiconductor device such as shown in FIG. 12 for example.

The host 700 may be included in a desktop computer, a laptop computer, a camera, a mobile device, a communication device, and the like. The host 700 provides an input signal for controlling and operating the memory 510. The memory 510 may serve as a data storing media.

Figure 31:
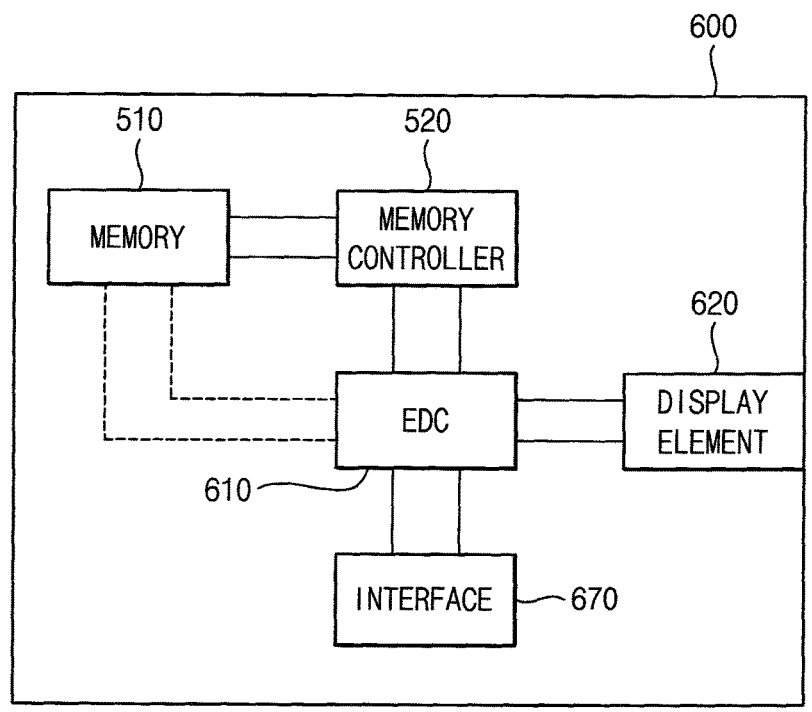

FIG. 31 is a block diagram of a system 600 having a stacked semiconductor device such as shown in FIG. 12 for example according to another example embodiment of the present invention. Referring to FIG. 31, the system 600 may be a portable device that includes a memory 510 implemented as the stacked semiconductor device such as shown in FIG. 12 for example. Examples of the portable device 600 include an MP3 player, a video player, a portable multimedia player (PMP), etc.

The portable device 600 includes the memory 510, a memory controller 520, an encoder/decoder (EDC) 610, a display element 620, and an interface 670. Data is input to or output from the memory 510 by way of the memory controller 520. As illustrated with the dashed lines of FIG. 31, data may be directly input from the EDC 610 to the memory 510, or data may be directly output from the memory 510 to the EDC 610.

The EDC 610 encodes data to be stored in the memory 510 such as by encoding audio and/or video data stored in the memory 510 of an MP3 player or a PMP player. Further, the EDC 610 may perform MPEG encoding for storing video data in the memory 510. Moreover, the EDC 610 may include multiple encoders to encode different types of data depending on their formats. For example, the EDC 610 may include an MP3 encoder for encoding audio data and an MPEG encoder for encoding video data.

The EDC 610 may also decode data that is output from the memory 510 such as by performing MP3 decoding for audio data from the memory 510. Alternatively, the EDC 610 may perform MPEG decoding of video data from the memory 510. Moreover, the EDC 610 may include multiple decoders to decode different types of data depending on their formats. For example, the EDC 610 may include an MP3 decoder for audio data and an MPEG decoder for video data.

In other embodiments, the EDC 610 may include only a decoder. For example, encoded data may be input to the EDC 610, and then the EDC 610 may decode the input data for transfer in the memory controller 520 or the memory 510.

The EDC 610 may receive data to be encoded or data being encoded by way of the interface 670. The interface 670 complies with established interface standards (e.g., FireWire, USB, etc.) to include a FireWire interface, a USB interface, etc. Thus, data may be output from the memory 510 by way of the interface 670.

The display element 620 displays a representation of user data that is output from the memory 510 and decoded by the EDC 610. Examples of the display element 620 include a speaker outputting an audio representation of the data, a display screen outputting a video representation of the data, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept.

Accordingly, all such modifications are intended to be included within the scope of the present inventive concept as defined in the claims. In the claims, means-plus-function clauses are intended to cover the structures described herein as performing the recited function and not only structural equivalents but also equivalent structures.

Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

The present invention is limited only as defined in the following claims and equivalents thereof.

The invention claimed is:

1. A semiconductor device, comprising:
a via structure having an upper surface with a planar portion and with a rounded protrusion portion, the rounded protrusion portion being surrounded by the planar portion; and
a conductive line disposed at least on the planar portion of the upper surface of the via structure,
wherein the conductive line is not disposed over at least a part of said rounded protrusion portion of the upper surface of the via structure,
and wherein the via structure is a TSV (through silicon via) formed within an opening through a semiconductor substrate and through a dielectric layer formed over the semiconductor substrate.

2. The semiconductor device of claim 1, wherein another conductive line extends over a central portion of the upper surface of the via structure.

3. A semiconductor device, comprising:
a via structure having an upper surface with a planar portion and with a rounded protrusion portion, the rounded protrusion portion being surrounded by the planar portion; and
a plurality of conductive structures on the upper surface of the via structure,
wherein at least one of the plurality of conductive structures is formed on the planar portion of the upper surface of the via structure while not being disposed over at least a part of said rounded protrusion portion of the upper surface of the via structure,
and wherein the via structure is a TSV (through silicon via) formed within an opening through a semiconductor substrate and through a dielectric layer formed over the semiconductor substrate.

4. The semiconductor device of claim 3, wherein at least one of the plurality of conductive structures is formed on a central portion of the upper surface of the via structure.

5. The semiconductor device of claim 3, wherein at least one of the plurality of conductive structures is formed both on the upper surface of TSV and an upper surface of the dielectric layer that is adjacent to the upper surface of TSV.

6. The semiconductor device of claim 3, wherein each of the plurality of conductive structures extends in a first direction and the plurality of conductive structures are spaced apart from each other in a second direction substantially perpendicular to the first direction, and
wherein at least one of the plurality of conductive structures contacts both of the upper surface of TSV and an upper surface of the dielectric layer that is adjacent to the upper surface of the TSV along the second direction.

7. The semiconductor device of claim 3, wherein the TSV includes:
an insulation layer disposed at an inner wall of the opening;
a barrier layer disposed on the insulation layer within the opening; and
a conductive fill within the opening with the barrier layer surrounding at least a portion of the conductive fill.

8. The semiconductor device of claim 7, wherein the TSV further includes:
a center fill within the opening with the conductive fill surrounding at least a portion of the center fill.

9. The semiconductor device of claim 8, wherein the center fill has a thermal expansion coefficient that is lower than that of the conductive fill such that the rounded protrusion portion is formed as a ring.

10. The semiconductor device of claim 3, wherein the TSV is coupled to a contact structure of another semiconductor device for forming a stacked semiconductor device.

11. The semiconductor device of claim 10, wherein the stacked semiconductor device is a memory device.

12. The semiconductor device of claim 3, further comprising a buffer layer on a portion of the upper surface of the via structure that is not covered by the plurality of conductive structures.

13. A semiconductor device, comprising:
a via structure filling an opening through a semiconductor substrate, the via structure having an upper surface with a planar portion and with a protrusion portion, the planar portion surrounding and directly contacting the protrusion portion, and both of the planar portion and the protrusion portion vertically overlapping the opening,
wherein the planar portion and the protrusion portion are comprised of a same conductive material; and
a conductive line formed to directly contact at least a part of the planar portion of the upper surface of the via structure,
and wherein the conductive line does not directly contact at least a part of said protrusion portion of the upper surface of the via structure;
and wherein an uppermost level of the protrusion portion is disposed further from the semiconductor substrate than any of the planar portion.

14. The semiconductor device of claim 13, wherein the via structure is a TSV (through silicon via) filling the opening through the semiconductor substrate and penetrating through a dielectric layer formed over the semiconductor substrate.

15. The semiconductor device of claim 13, wherein the TSV includes:
an insulation layer disposed on an inner wall of the opening;
a barrier layer disposed on the insulation layer within the opening; and
a conductive fill within the opening with the barrier layer surrounding at least a portion of the conductive fill.

* * * * *